United States Patent [19]

Iwamura et al.

[11] Patent Number: 5,734,913
[45] Date of Patent: Mar. 31, 1998

[54] LOW POWER CONSUMPTION SEMICONDUCTOR INTEGRATED CIRCUIT DEVICE AND MICROPROCESSOR

[75] Inventors: Masahiro Iwamura; Shigeya Tanaka; Hideo Maejima, all of Hitachi; Tetsuo Nakano, Tokyo, all of Japan

[73] Assignee: Hitachi, Ltd., Tokyo, Japan

[21] Appl. No.: 462,662

[22] Filed: Jun. 5, 1995

Related U.S. Application Data

[63] Continuation of Ser. No. 136,990, Oct. 18, 1993, Pat. No. 5,457,790, which is a continuation of Ser. No. 973,576, Nov. 9, 1992, abandoned, which is a continuation of Ser. No. 627,847, Dec. 14, 1990, abandoned.

[30] Foreign Application Priority Data

Dec. 15, 1989 [JP] Japan ................................. 1-324928
Aug. 3, 1990 [JP] Japan ................................. 2-205006

[51] Int. Cl.⁶ ............................................ G06F 1/32
[52] U.S. Cl. ..................... 395/750; 395/389; 395/494; 365/227
[58] Field of Search ............................. 395/750, 775, 395/800, 375, 389, 388, 560, 557, 556, 555, 494, 496; 365/227

[56] References Cited

U.S. PATENT DOCUMENTS

| | | |
|---|---|---|
| 3,736,569 | 5/1973 | Bouricius et al. |
| 4,137,563 | 1/1979 | Tsunoda. |
| 4,236,205 | 11/1980 | Kindseth et al. |
| 4,961,172 | 10/1990 | Shubat et al. |
| 5,060,188 | 10/1991 | Zulian et al. |
| 5,203,003 | 4/1993 | Donner .................. 395/800 |
| 5,276,824 | 1/1994 | Shruhak et al. ............ 395/375 |
| 5,295,249 | 3/1994 | Blaner et al. ............. 395/375 |
| 5,392,437 | 2/1995 | Matter et al. ............. 395/750 |
| 5,398,321 | 3/1995 | Jeremiah .................. 395/375 |
| 5,410,714 | 4/1995 | Yorimoto et al. ........... 395/750 |
| 5,457,790 | 10/1995 | Iwamura et al. ............ 395/494 |
| 5,495,617 | 2/1996 | Yamada .................... 395/750 |

FOREIGN PATENT DOCUMENTS

| | | | |
|---|---|---|---|
| 2825770A1 | 1/1980 | Germany | G06F 1/00 |
| 61-45354 | 3/1986 | Japan | G06F 15/06 |

OTHER PUBLICATIONS

"RISC of the Next Generation, CMOS with Parallel Processing for 100MIPS", NIKKEI Electronics, No. 487, pp. 191–200, Nov. 1989.

Von Karl Reiβ, "Integrierte Digitalbausteine", Siemens Aktiengesellschaft, 1970, pp. 214–219.

*Primary Examiner*—Glenn A. Auve
*Attorney, Agent, or Firm*—Antonelli, Terry, Stout, & Kraus, LLP

[57] ABSTRACT

In semiconductor integrated circuit device and microprocessor including at least one functional circuit block, the start of operation of the functional circuit block is detected prior to the start of operation, the functional circuit block for which the start of operation has been detected is activated prior to the start of operation and inactivated after the termination of operation.

20 Claims, 24 Drawing Sheets

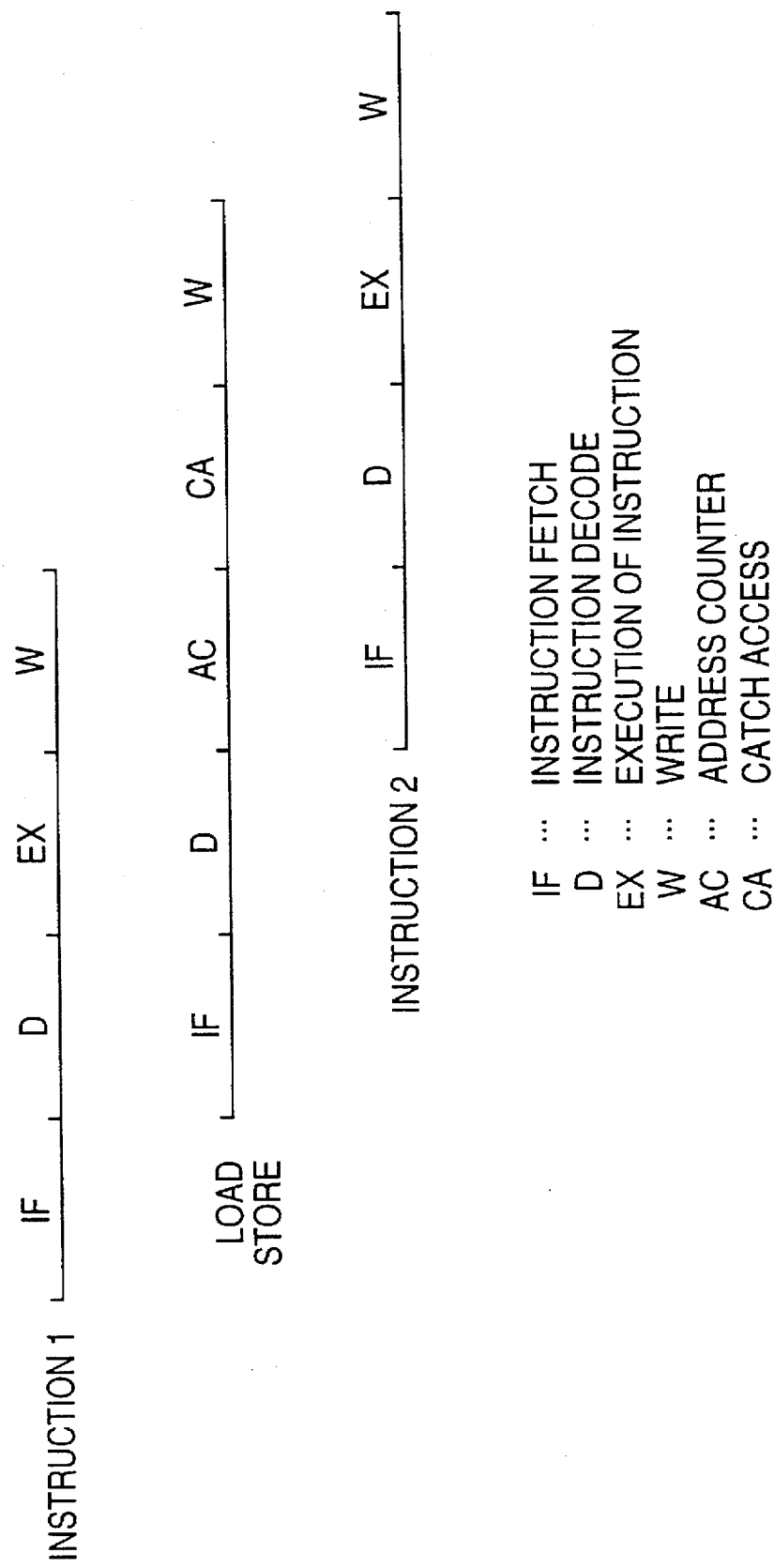

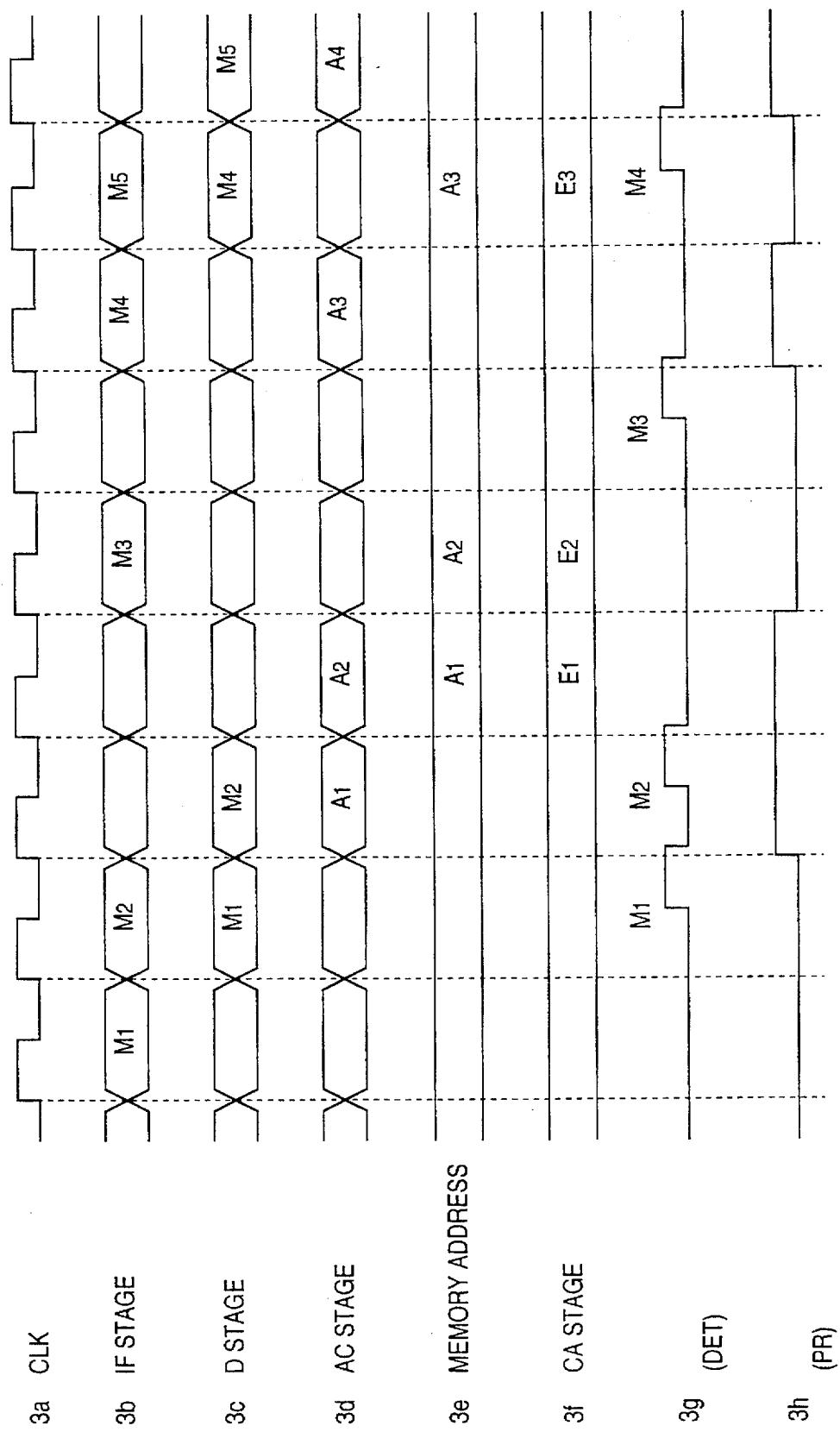

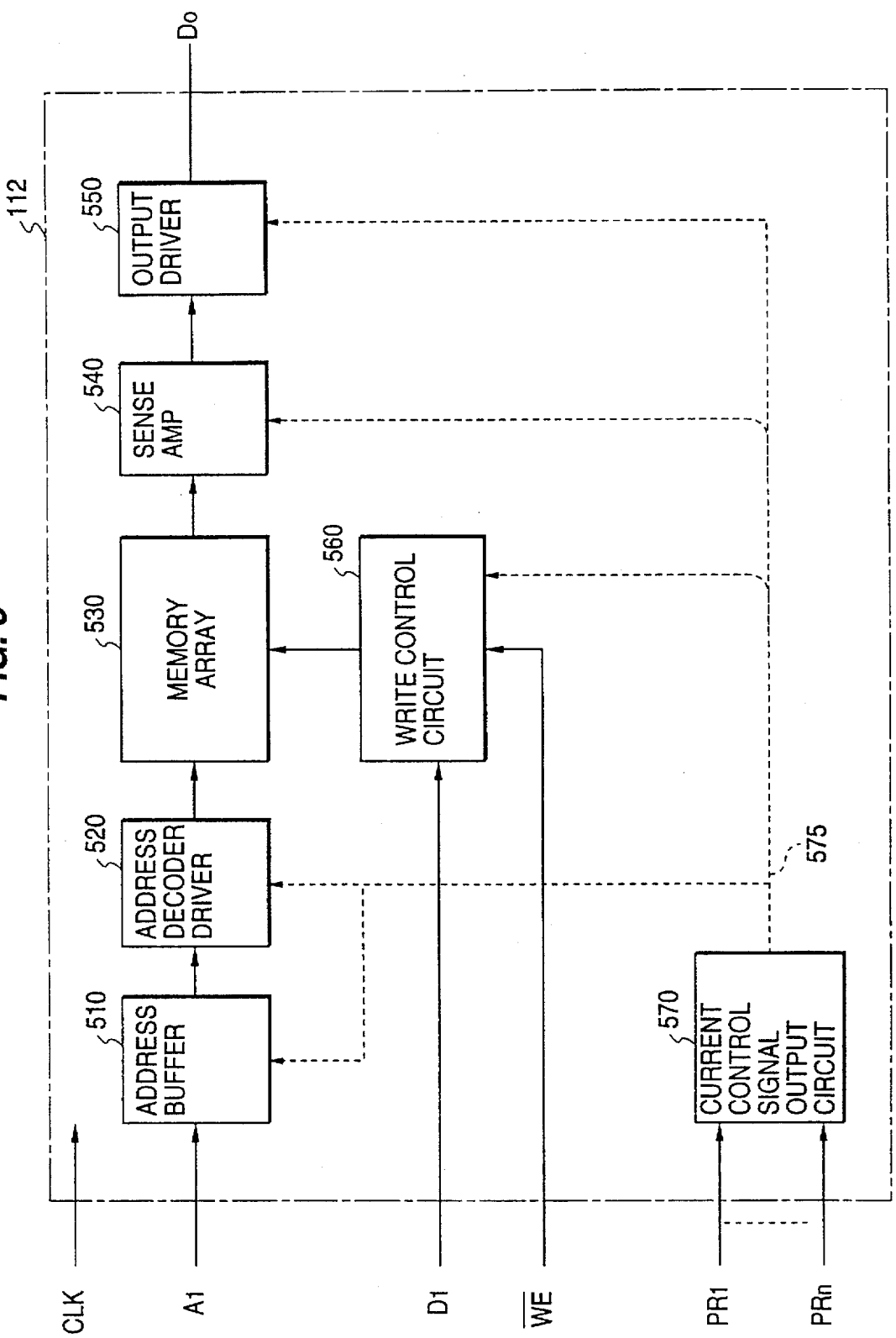

FIG. 13

| CLASS. | MNEMONIC CODE | OPERATION |
|---|---|---|
| BASIC INSTRUCTION | ADD R(S1), R(S2), R(T) | R(S1) + R(S2) → R(T) |
| | SUB " | R(S1) - R(S2) → R(T) |
| | AND " | R(S1) AND R(S2) → R(T)(FOR LEACH BIT) |
| | OR " | R(S1) OR R(S2) → R(T)(FOR LEACH BIT) |
| | EOR " | R(S1) EXOR R(S2) → R(T)(FOR LEACH BIT) |
| | NOT R(S1), R(T) | NOT R(S1) → R(T)(FOR LEACH BIT) |
| | SFT R(S1), i, R(T) | SHIFT R(S1) BY i AND STORE TO R(T) |
| | NOP | NO OPERATION |
| BRANCH INSTRUCTION | BRA d | PC + d → PC |
| | BRA CC d | IF CONDITION CODE IS TRUE PC + d → PC. IF CONDITION CODE FAILS, NEXT PC |
| LOAD/STORE INSTRUCTION | LOAD R(S1), R(S2), R(T) | STORE CONTENTS OF MEMORY POINTED BY R(S1) + R(S2) TO R(T) |
| | STORE " | STORE CONTENTS OF R(T) TO MEMORY POINTED BY R(S1) + R(S2) |
| SYSTEM CONTROL INSTRUCTION | PSW SET R(1) | SET CONTENT OF R(1) TO PSW |
| | PSW READ R(1) | STORE CONTENT OF R(1) TO PSW |

IF ···INSTRUCTION FETCH
D ···DECODE
EX ···EXECUTION
T ···TEST OR DATA CACHE ACCESS
W ···WRITE

FIG. 21

| SECOND INSTRUCTION / FIRST INSTRUCTION | BASIC INSTRUCTION | BRANCH INSTRUCTION | LOAD/STORE INSTRUCTION | SYSTEM CONTROL INSTRUCTION |
|---|---|---|---|---|
| BASIC INSTRUCTION | ○ | ○ | ○ | × |
| BRANCH INSTRUCTION | ○ | × | ○ | × |
| LOAD/STORE INSTRUCTION | ○ | ○ | × | × |
| SYSTEM CONTROL INSTRUCTION | × | × | × | × |

○ POSSIBLE TO PROCESS TWO INSTRUCTION IN PARALLEL
×

LOW POWER CONSUMPTION SEMICONDUCTOR INTEGRATED CIRCUIT DEVICE AND MICROPROCESSOR

This is a continuation of application Ser. No. 08/136,990, filed Oct. 18, 1993 (issued as U.S. Pat. No. 5,457,790 on Oct. 10, 1995), which is a continuation of application Ser. No. 07/973,576, filed on Nov. 9, 1992 (abandoned), which is a continuation of application Ser. No. 07/627,847, filed on Dec. 14, 1990 (abandoned).

BACKGROUND OF THE INVENTION

The present invention relates to a semiconductor integrated circuit device having a functional circuit block (such as a memory, an arithmetic and logic unit or an I/O controller) for which low power consumption is desired, such as a built-in cache memory for which high speed accessing and multi-bit output are required, and to a microprocessor.

In a recent high speed microprocessor (MPU), it is common to build in a cache memory in the MPU and enhance a parallel operation to improve a processing capability in order to solve a problem caused by the inconsistency of an internal instruction execution speed and a transfer speed of an instruction and an operand from an external main memory. As a result, the increase of power consumption has become a serious problem.

A primary purpose of building in the cache memory is to fetch an instruction or data at a high speed consistent with an execution speed of the MPU.

A clock period of a complex instruction set computer (CISC) type MPU which is of a highest speed as of today is 25-40 MHz. It is expected that in a near future a reduced instruction set computer (RISC) type MPU which is over 100 MHz will come up.

In such an ultra high speed MPU, an ultra high accessing speed of less than several ns is required for the built-in cache memory.

The built-in cache memory has a feature of a relatively small number of words and an extremely large number of readout bits per word (8 bits at maximum in a general purpose SRAM). For example, in a today 32-bit MPU, the parallel readout of several hundreds bits is common, and the number of parallel readout bits will further increase if a 64-bit MPU is introduced in future.

In general, a differential type high sensitivity sense amplifier which uses bipolar transistors is suitable for a sense amplifier of the ultra high speed memory. However, this circuit constantly consumes a relatively large power. Further, a power is consumed by other portion of the memory even if the memory is not accessed unless special power consumption saving means is provided.

Thus, in a single chip MPU which builds in an ultra high accessing speed and multi-bit parallel output cache memory, the power consumption by the memory circuit is extremely large and an on-chip cache memory would ultimately be not attained unless appropriate power consumption saving means is provided.

In first prior art technique known as power consumption saving technique, the memory circuit is switched between a power consumption in a stand-by mode and a power consumption in a normal operation mode by a chip select signal CS which is equivalent to a memory address signal in order to reduce an effective power consumption.

In another prior art technique, a change in an address signal is detected by an address transition detector (ATD) circuit, a clock pulse required for an internal operation is generated in response to the detection signal, and a sense amplifier of a memory is activated only for a required period to reduce the power consumption.

Further, as shown in JP-A-61-45354, in a logic LSI such as an MPU, a) a method of providing power control instructions one for each of a plurality of functional blocks and selectively activating and de-activating corresponding functional blocks by a program to reduce the power consumption, b) a method for providing a clock control circuit for each functional block and controlling the supply or the non-supply of a clock is controlled to reduce the power consumption, and c) a method of providing a power control circuit for each functional block and stopping the supply of a power to the functional block which is not used in the execution of an instruction to reduce the power consumption, have been known. However, in the prior art, consideration is not paid to noises induced in a power line and a ground line by a sudden change in a power supply current during the switching between the normal power consumption mode and the low power consumption mode. Thus, it includes the following problems. 1) Since the circuit current significantly changes in a short time between the low power consumption mode and the normal operation mode, a large noise voltage is induced by inductances and resistances of the power line and the ground line. 2) The functional circuit itself or other internal circuit malfunctions due to the noise voltage. Even if it does not malfunction, a certain time period is required to extinguish the noise voltage and an effective memory accessing speed is lowered.

FIG. 24(a) illustrates the development of the noise voltage of the power supply line. Numeral 1300 denotes a power supply, numeral 1310 denotes a functional circuit block such as a memory circuit, numerals 1321 and 1322 denote inductances of the power supply line and a ground system, respectively, and numerals 1331 and 1332 denote resistances of the power supply line and the ground system, respectively.

FIG. 24(B) shows a change in a power supply current i and changes in a power supply voltage $v_1$ and a ground potential $v_2$ when a switch SW is turned on at a time $t_1$ and turned off at a time $t_2$.

As shown, when the switch SW is turned on at the time $t_1$, the circuit current i changes from zero to a steady state current in a time period $\Delta t_1$. The power supply voltage $v_1$ of the circuit largely changes to exhibit a peak in a negative direction, and the ground largely change $t_o$ exhibit a peak in a positive direction. On the other hand, when the switch SW is turned off at the time $t_2$, the circuit current i changes from the steady state current to zero in a time period $\Delta t_2$. The power supply voltage $v_1$ of the circuit largely changes to exhibit a peak in the positive direction, and the ground potential $v_2$ largely changes to exhibit a peak in the negative direction.

It is assumed that the circuit 1310 of FIG. 24 comprises 500 sense amplifiers which consume current of 2 mA per circuit and the current is switched from zero to the steady state current in $\Delta t = 1$ ns. Assuming that the resistances 1331 and 1332 are neglected and the inductances 1321 and 1322 are L=5 nH, the power supply noise $v_n$ is given by $$V_n = L \frac{\Delta I \times 500}{\Delta t} = 5 nH \times \frac{2 mA \times 500}{1 ns} = 5V$$

Such a large power supply noise is not permitted in the today's semiconductor integrated circuit which operates at a power supply voltage of 5 volts or lower.

Even if the noise can be reduced to an appropriate level, the times $t_1$ and $t_2$ are required to extinguish the power supply noise and the ground noise, as shown in FIG. 24(B). This time depends on the current switching time and it is normally 103 ns. This time is not acceptable by the ultra high speed memory which requires the access time of less than several ns, and it is a great obstacle to the high speed operation.

The problem caused by the change in the power supply current is equally applicable to a plurality of arithmetic and logic units in a semiconductor chip and other functional circuit block.

In a recent high performance MPU, various techniques have been introduced in order to enhance its processing performance. The processing performance of the computer is evaluated by:

$$\text{Performance} = \frac{\text{Operation frequency}}{\text{No. of instruction steps} \times CPI}$$

where CPI is the number of cycles required for one instruction.

A noticeable technology in those several years is a RISC processor. In the RISC, it is a primary goal to proximate the CPI to one in order to enhance the performance.

Recently, a super scalar and a VLIW (very long instruction word) have been noticed as the next technology to the RISC. In this technology, up to n instructions are parallelly read, the n instructions are parallelly decoded and the n instructions are parallelly executed. By increasing the parallelism of the hardware, the CPI in the above formula is reduced to 1/n in order to enhance the performance of the computer. In the high speed arithmetic and logic circuit of the super scalar or the VLIW, a differential logic circuit by bipolar transistors or a low amplitude circuit by BiCMOS is used, but a circuit which draws a DC current steadily consumes a relatively high power.

In the super scalar or VLIW MPU, n high speed arithmetic and logic circuits of the same function are required. As a result, the power consumption of the arithmetic and logic circuits increases by the factor of n.

A related technology is discussed in NIKKEI Electronics, No. 487 Nov. 27, 1989, pages 191–200.

As seen from the above description, in the prior art power consumption saving technique in the semiconductor integrated circuit or electronic circuit such as a microprocessor, the problem of noise developed on the ground line or the power supply line when the power is switched is not taken into account and hence the circuit malfunctions or a certain time is required before the noise disappears, and a rapid start-up is not attained.

In the prior art MPU having the on-chip memory, because of trade-off between the noise reduction in the power switching and the speed-up of the memory accessing, it is difficult to attain very high operating speed.

While the microprocessor having a cache memory has been discussed above, the same problem is encountered in a semiconductor integrated circuit or an electronic circuit having a functional block which requires a high speed operation.

SUMMARY OF THE INVENTION

It is an object of the present invention to provide a semiconductor integrated circuit device and a microprocessor which are of low power consumption and operable at a high speed.

It is another object of the present invention to attain low power consumption and high speed in a functional circuit block of a semiconductor integrated circuit.

It is other object of the present invention to provide a semiconductor integrated circuit device and a microprocessor which prevent a noise from generating when a power to a functional circuit block is switched and operate without malfunction.

It is a further object of the present invention to attain low power consumption and high speed in a microprocessor having an on-chip memory such as a cache memory.

It is a still further object of the present invention to attain low power consumption and high speed in a parallel processing microprocessor.

In order to achieve the above objects, in accordance with the present invention, the semiconductor integrated circuit device or microprocessor having at least one functional block detects the start of operation of the functional circuit block prior to the start of operation, activates the functional circuit block whose start of operation has been detected, prior to the start of operation, and deactivate the functional circuit block after the operation.

The activation means to supply a predetermined power required for the circuit operation, and the deactivation means to supply a lower power than the predetermined power.

The semiconductor integrated circuit device of the present invention comprises a memory, detection means for detecting memory accessing prior to the memory accessing in accordance with information relating to the memory accessing, and means for activating the memory prior to the memory accessing when the detection means detected the memory accessing.

In the present invention, the memory may be a clock synchronized memory, and means for generating a memory clock signal for clocking the memory based on a system clock signal of the semiconductor integrated circuit device and the access previous notice signal may be provided.

Alternatively, means for generating a pulse for activating a sense amplifier of the memory based on the system clock signal of the semiconductor integrated circuit device and the access previous notice signal may be provided so that a portion of or whole sense amplifier of the memory is activated by the activation pulse.

In accordance with another feature of the present invention, a functional circuit block having a power supply inductance L, an allowable power supply noise $V_n$ and a circuit current changing amplitude $\Delta I$, and means for generating a start of operation previous notice signal to activate the functional circuit block a time T prior to the start of operation of the functional circuit block are provided, wherein T, L, $V_n$ and $\Delta I$ meet a relation of $$T \geq L \frac{\Delta I}{V_n}$$

The microprocessor of the present invention is characterized by the provision of a memory, a first instruction decoder for decoding an instruction and instructing the execution thereof to the memory, a second instruction decoder for detecting the accessing to the memory prior to the start of accessing to generate an access previous notice signal, and activation means for preactivating the memory in response to the previous notice signal.

The second instruction decoder may be one which generates the access previous notice signal in at least one stage prior to the execution stage of the memory access, and the activation means may be one which increases a drive current for the memory from a lower current level than a predetermined operating current level to the predetermined operating current level at a predetermined rate from the time of generation of the access previous notice signal to the start time of the memory access execution stage.

The microprocessor of the present invention has at least one functional circuit block, a first instruction decoder for decoding an instruction and instructing the execution thereof to the functional circuit block, a second instruction decoder for detecting the execution by the functional circuit block prior to the start of execution to generate an operation previous notice signal, and activation means for activating the functional circuit block prior to the start of execution in response to the previous notice signal.

The memory of the present invention has a functional circuit block which receives a previous notice signal for the start of operation, increases a circuit current to a predetermined level in a predetermined time starting from the reception of the previous notice signal to shift from a low power consumption mode to a normal power consumption mode, and after the execution of operation, reduces the circuit current to the low power consumption mode current in a predetermined time to shift to the low power consumption mode, and the memory is activated by the access previous notice signal and executes a predetermined memory operation in accordance with an address signal, a read/write control signal and a data input/output signal.

The memory has an information processing unit such as a work station or a computer which includes at least one of the semiconductor integrated circuit device, the microprocessor, the functional circuit block and the memory.

BRIEF DESCRIPTION OF THE DRAWINGS

These and other objects, features and advantages of the present invention will be understood more clearly from the following detailed description with reference to the accompanying drawings, wherein FIG. 2 illustrates an instruction execution stage of a microprocessor, FIG. 3 shows a timing chart of an operation timing of the microprocessor, FIG. 5 shows a block diagram of a configuration of a cache memory, FIG. 13 shows a list of instructions, FIG. 21 illustrates a combination rule of instructions in two-instruction parallel execution.

DESCRIPTION OF THE PREFERRED EMBODIMENTS

An embodiment of a semiconductor integrated circuit of the present invention is now explained with reference to a microprocessor.

Figure 1:
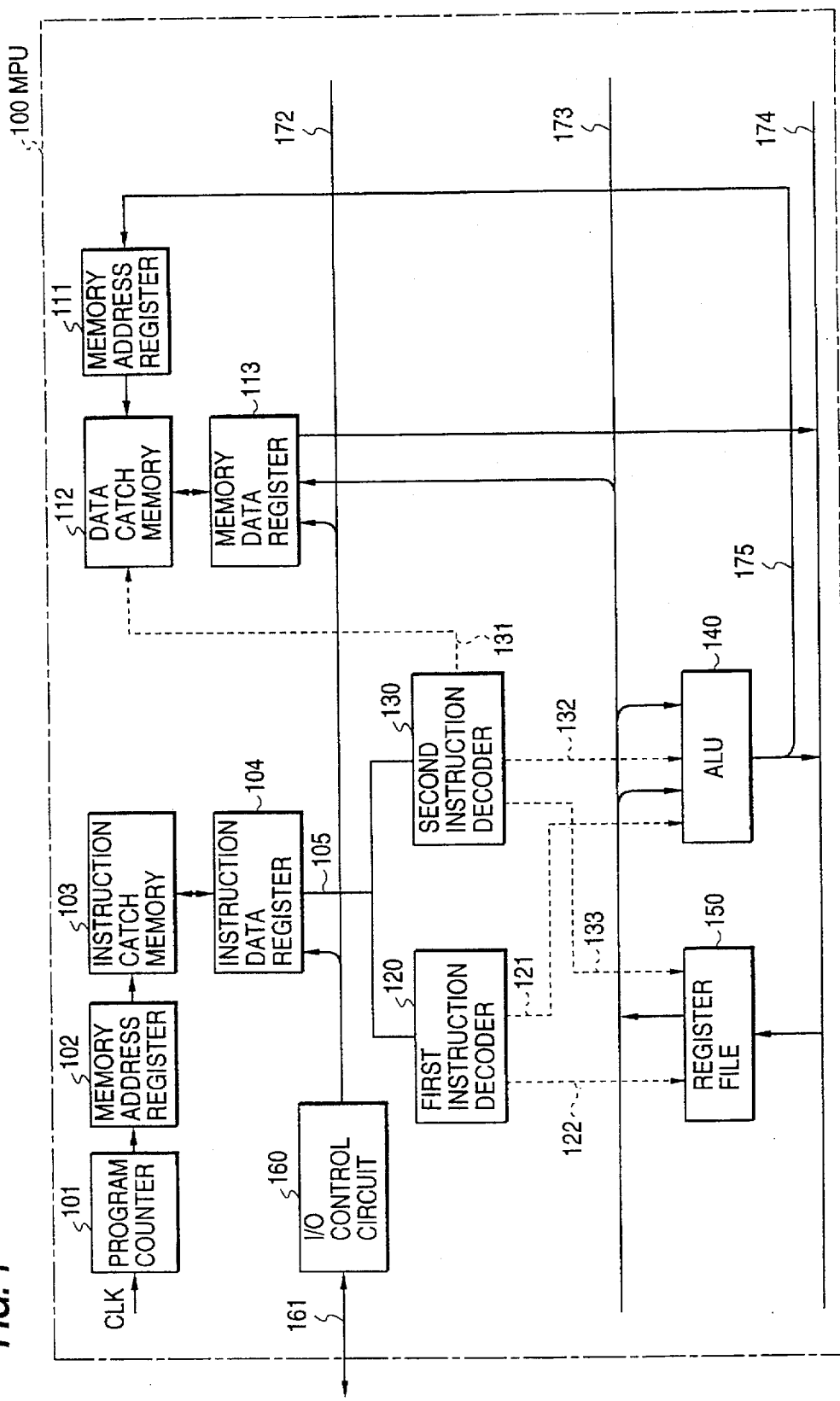
FIG. 1 shows a block diagram of a configuration of a microprocessor in accordance with a first embodiment of the present invention.

FIG. 1 shows a configuration of a microprocessor (MPU) in accordance with a first embodiment of the present invention.

Numeral 100 denotes a single chip MPU. For the convenience of explanation, only those elements of the internal configuration which are necessary to understand the present embodiment are shown and other elements are omitted.

Numeral 101 denotes a program counter which generates a fetch address of instruction data in synchronism with a clock signal CLK. Numeral 102 denotes a memory address register which holds a fetch address of an instruction cache memory 103. Numeral 104 denotes an instruction data register which holds the instruction data fetched from the instruction cache 103.

Numeral 111 denotes another memory address register which holds a read or write address of a data cache 112, while numeral 113 denotes a data register which holds read data of the data cache 112 or write data for the data cache 112.

The instruction data register 104 and the data register 113 are coupled by an internal data bus 172 and exchange data with an external data bus 161 through an input/output controller 160.

Numeral 120 denotes a first instruction decoder which decodes an output 105 of the instruction register 104 and produces instruction control signals 121 and 122. Numeral 140 denotes an arithmetic and logic unit which receives data necessary for operation from a register file 150 through an internal bus 173, executes an arithmetic operation, logical operation or shift operation, and writes an operation result into the register file 150 through an internal bus 174. In another case, it writes the operation result into a memory address register 111 through an internal bus 175.

An output 121 of the instruction decoder 120 designates a type of operation to the arithmetic and logic unit 140. An output 122 of the instruction decoder 120 designates a read or write operation to the register file 150.

Numeral 130 denotes a second instruction decoder which decodes the output 105 of the instruction register 104, predicts the memory accessing to the data cache 112 and supplies a memory access previous notice signal 131 to the data cache 112.

The data cache 112 executes predetermined memory accessing based on the memory access previous notice signal 131, the address signal from the memory address register 111 and a read/write control signal (not shown).

The second instruction decoder 130 may have a function to provide start of operation previous notice signals 132 and 133 to the arithmetic and logic unit 140, the register file 150 and other units, as required.

FIG. 2 shows a typical instruction execution stage of the MPU of the present embodiment.

Instructions 1 and 2 show an execution stage of an R—R operation (register to register operation).

In an IF stage, instruction data is fetched from the instruction cache 103. In a D stage, it is decoded by the instruction decoder 120. In an EX stage, a predetermined operation is executed by the arithmetic and logic unit 140. Finally, in a W stage, an operation result is written into the register file 150.

For a LOAD instruction and a STORE instruction shown in the middle of FIG. 2 by which the accessing to the data cache 112 is requested, the IF stage and the D stage thereof are same as those of the R—R operation. In the next AC stage, an effective address is calculated to access the data cache 112. In a CA stage, the data cache 112 is accessed. Finally, in the W stage, the fetched data is written into the register file 150.

As described above, in the LOAD/STORE instruction, there is always the effective address calculation stage AC between the decode stage D and the memory access stage CA. In the present embodiment, the memory access request is predicted in the D stage which is two sages prior to the CA stage, and the access previous notice signal is supplied to the cache memory 112.

FIG. 3 shows, in further detail, the operation timing from the instruction fetching to the generation of the access previous notice signal and the memory accessing.

Numeral 3a denotes the system clock CLK. A period thereof is equal to one stage period of the instruction execution stage of FIG. 3 and it may be 5 ns, for example. Numeral 3b denotes the IF stage. LOAD/STRE instructions $M_1$ to $M_5$ are fetched.

Numeral 3c denotes the D stage. In the next stage to the IF stage, the LOAD/STORE instructions $M_1$ to $M_5$ are decoded.

Numeral 3d denotes the AC stage. Effective addresses $A_1$ to $A_5$ for the LOAD/STORE instructions $M_1$ to $M_5$ decoded in the D stage 3c are calculated.

Numeral 3e denotes memory addresses $A_1$ to $A_3$ calculated by the address calculation. The memory accessing is actually effected in the CA stage 3f by using those addresses.

Numeral 3g denotes memory access predict signals $M_1$ to $M_4$ produced by the second instruction decoder 130 shown in FIG. 1. They are produced by decoding $M_1$ to $M_5$ in the D stage 3c. Numeral 3h denotes the memory access previous notice signal (3) produced by processing the memory access predict signals $M_1$–$M_5$ (3g). It is supplied to the data cache 112.

The access previous notice signal 3h is generated one stage earlier to the $E_1$ stage 3f in which the memory is actually accessed, and also generated one stage earlier than the $E_3$ stage.

Figure 4A:
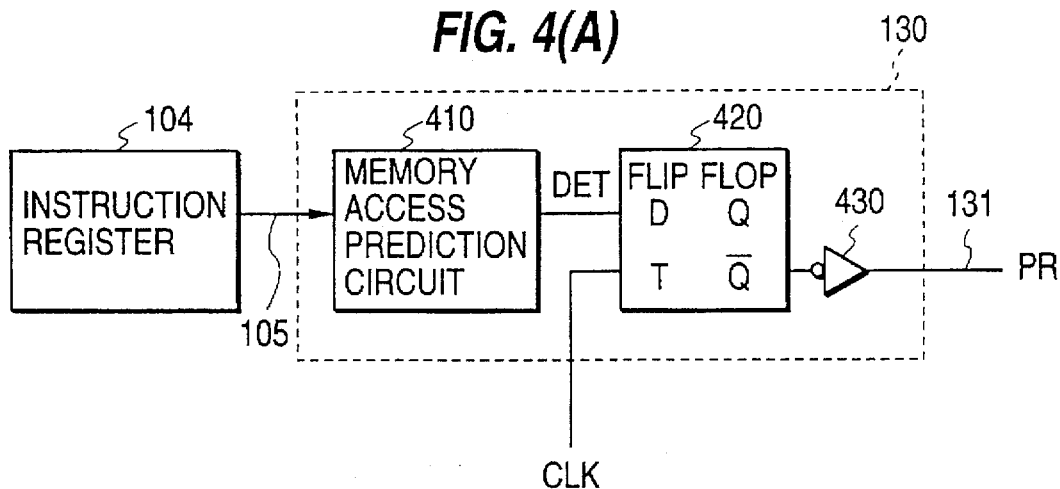
FIG. 4(A) shows a block diagram of a configuration of an access previous notice signal generator.
Figure 4B:
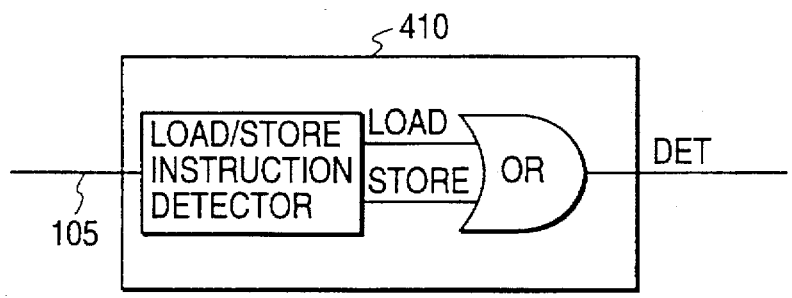
FIG. 4(B) shows a configuration of a memory access prediction circuit.
Figure 4C:
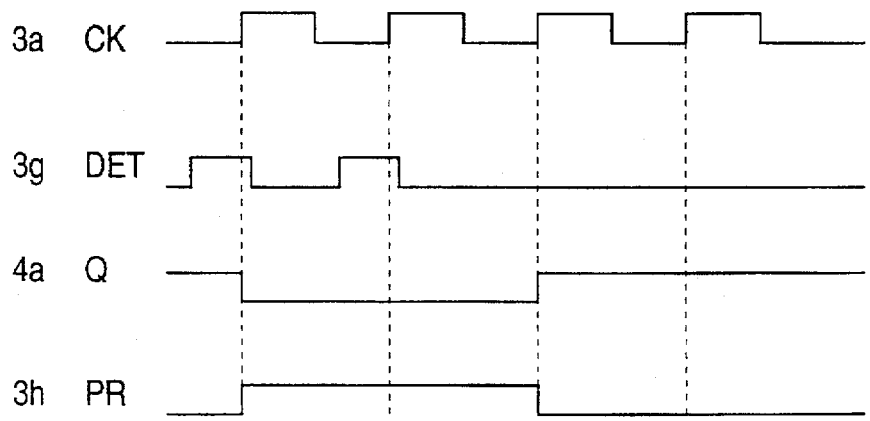
FIG. 4(C) shows a timing chart of an operation of the circuit.

FIG. 4(A) shows an internal configuration of the second instruction decoder 130 (see FIG. 1) which generates the memory access previous notice signal 131, FIG. 4(B) shows an internal configuration of the memory access prediction circuit 410, and FIG. 4(C) shows an operation timing.

Numeral 410 denotes the memory access prediction circuit which detects whether the instruction data supplied from the instruction register 104 is an instruction which causes the memory accessing or not. Particularly, as shown in FIG. 4(B), when the LOAD instruction and the STORE instruction are detected, a detection signal DET shown by 3g in FIG. 4(C) is generated. Numeral 420 denotes a flip-flop which latches the detection signal DET (3g) by the clock signal CLK (3a), an output $\overline{Q}$ (4a) of the flip-flop 420 to produce the access previous notice signal PR (3h) shown in FIG. 4(C).

The PR signal 131 is a positive active signal in the present embodiment although the polarity thereof is not essential.

FIG. 5 shows an internal configuration of the data cache memory 112 (see FIG. 1).

Numeral 510 denotes an address buffer which receives an address signal $A_i$ and produce positive and negative address signals required by an address decoder driver 520. An output of the address decoder driver 520 is supplied to a memory array 530 to select a memory array to read from or write to.

Numeral 540 denotes a sense amplifier which amplifies a small signal read from the memory array to a predetermined signal level. Numeral 550 denotes an output driver which drives an output $D_o$ having a relatively heavy load.

Numeral 560 denotes a write control circuit which writes write data $D_i$ to a predetermined address of the memory array 530 by a write control signal $\overline{WE}$.

Numeral 570 denotes a current control signal generator which receives the access previous notice signal PR to generate at least one current control signal 575. In the present embodiment, it receives a plurality of previous notice signals $PR_1, \ldots PR_n$ to generate at least one current control signals 575 on the assumption that the data cache memory 112 is shared or there is an access request other than the instruction execution.

The control of the circuit current by the current control signal 575 is applicable to all circuit elements except the current control signal generator 570 in the cache memory 112. The selection of the circuit to be controlled depends on the configuration and application of the actual applicable hardware.

Figure 6A:
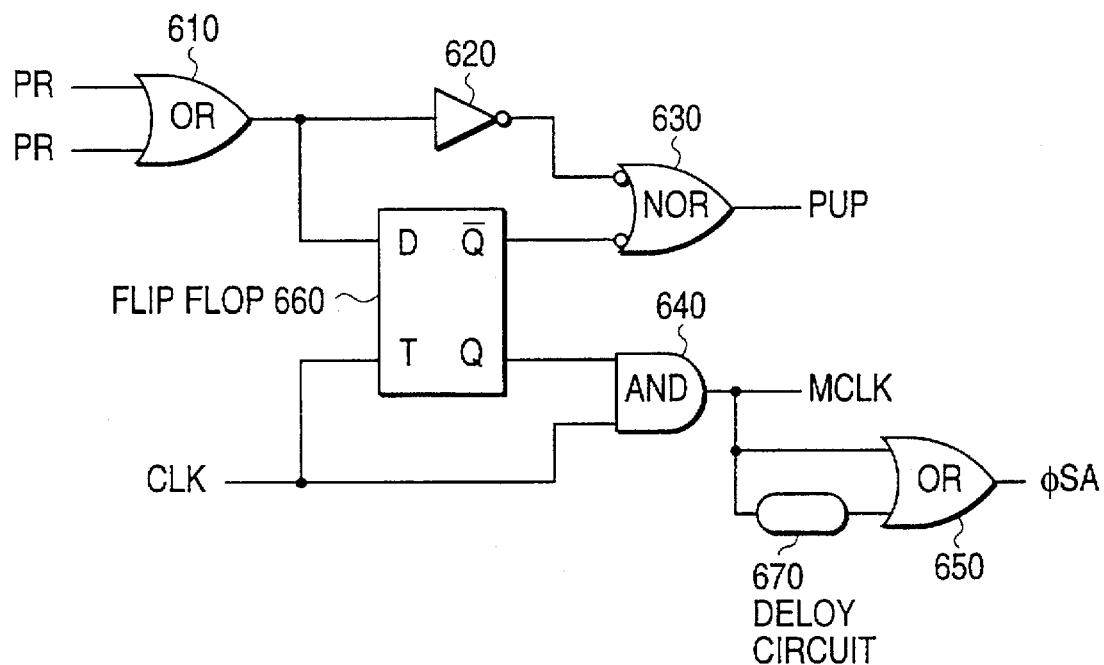
FIG. 6(A) shows a circuit diagram of a current control signal generator.
Figure 6B:
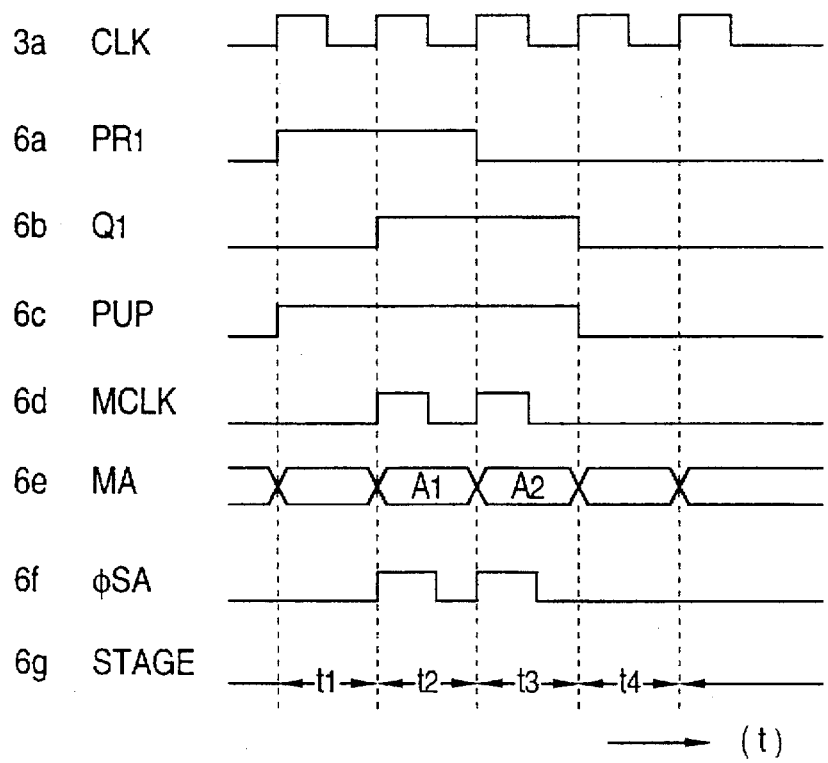
FIG. 6(B) shows a timing chart of an operation thereof.

FIG. 6(A) shows a configuration of the current control signal generator (see FIG. 5) and FIG. 6(B) shows an operation timing thereof.

Numeral 610 denotes an OR gate which ORs the access previous notice signals $PR_1$ to $PR_n$ and supplies an output to an inverter 620 and a flip-flop 660. Numeral 630 denotes a NOR gate which NORs an output of the inverter 620 and a $\overline{Q}$ output of the flip-flop 660 to produce a signal PUP shown by 6c in FIG. 6(B).

Numeral 640 denotes an AND gate which ANDs a Q output 6b of the flip-flop 660 and the clock signal CLK 3a to produce a signal MCLK 6d shown in FIG. 6(B). Numerals 650 and 670 denote OR gate and delay circuit, respectively. The OR gate 650 ORs the MCLK signal 6d and the MCLK signal delayed by a predetermined time by the delay circuit 670 to produce a signal φSA of shown in FIG. 6(B).

MA 6e in FIG. 6(B) shows a memory address in the memory access execution cycle.

As shown in FIG. 6(B), the memory accessing to the memory addresses $A_1$ and $A_2$ is effected in the $t_2$ and $t_3$ stages 6g. On the other hand, the PUP signal 6c rises in the $t_1$ stage which is one stage earlier than the $t_2$ stage and falls at the end of the $t_3$ stage.

Figure 7:
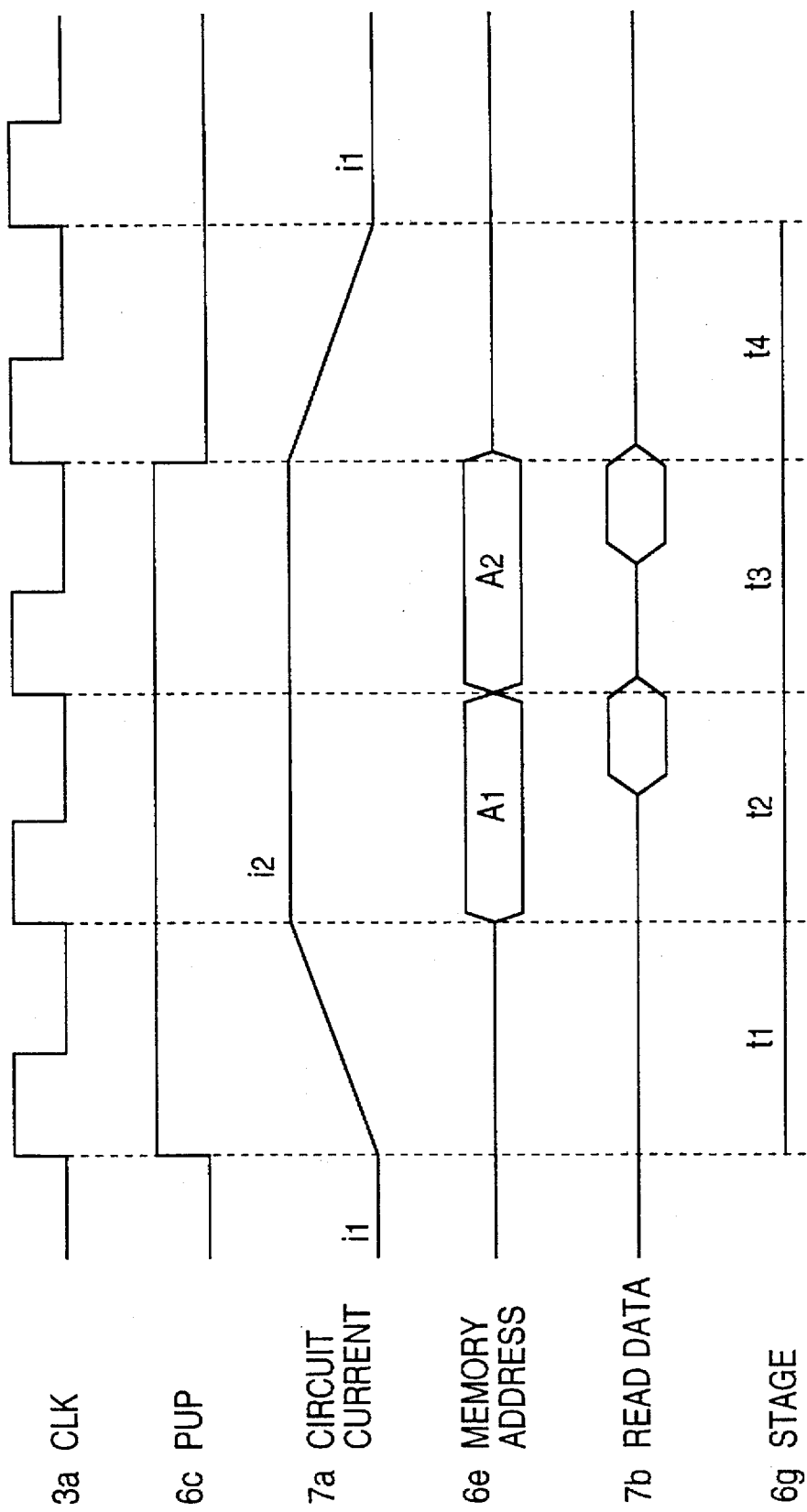
FIG. 7 shows a time chart which shows a relation between the access previous notice signal and a power supply current.

The circuit current is controlled based on the PUP signal 6c. This is shown in FIG. 7. As shown by 7a in FIG. 7, the current of the circuit under control is increased from $i_1$ to a predetermined current $i_2$ in accordance with the PUP signal 6c, and the current level is maintained in the $t_2$ and $t_3$ memory access stage, and the current level is decreased to the low current level $i_1$ from the beginning of the $t_4$ stage in which the memory accessing is completed.

The MCLK signal 6d (FIG. 6B) is a pulse signal which is generated in the memory access stages $t_2$ and $t_3$ and it is useful as a memory clock in a clock synchronized memory. The clock synchronized memory is shown in the following references.

1) Kevin J. O'connor: Modular Embedded Cache Memory for a 32b Pipelined RISC Microprocessor, 1987 IS SCC p. 256–257
2) Masanori Odaka et al: A512 kb/5 ns BiCMOS RAM With 1 KG/150 ps Logic Gate Array, 1989 IS SCC p. 28–29
3) Masayoshi Kimoto et al: A 1.4 ns/64 kb RAM With 85 ps/3688 Logic Gate Array. 1988 CI CC p. 15.8.1–15.8.4

The φSA signal 6f is generated in the memory access stages $t_2$ and $t_3$ and it is useful as a signal to activate the sense amplifier only for a predetermined period.

By independently controlling the activation of the sense amplifier, the power supply noise caused by the current switching is maintained within an allowable range and it may be used as a signal to minimize the activation time of the sense amplifier which consumes a high power.

An example of the circuit current control by the PUP signal and the φSA signal is shown below.

Figure 8B:
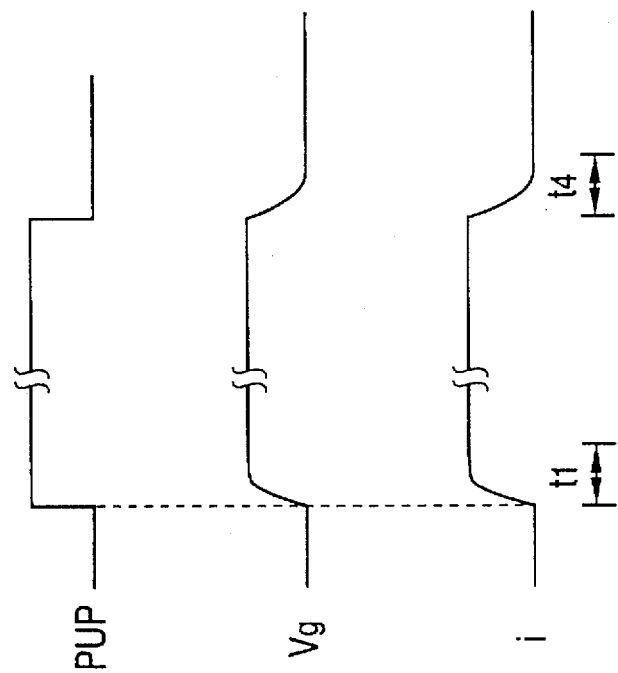
FIG. 8(B) shows a timing chart of an operation thereof.
Figure 8A:
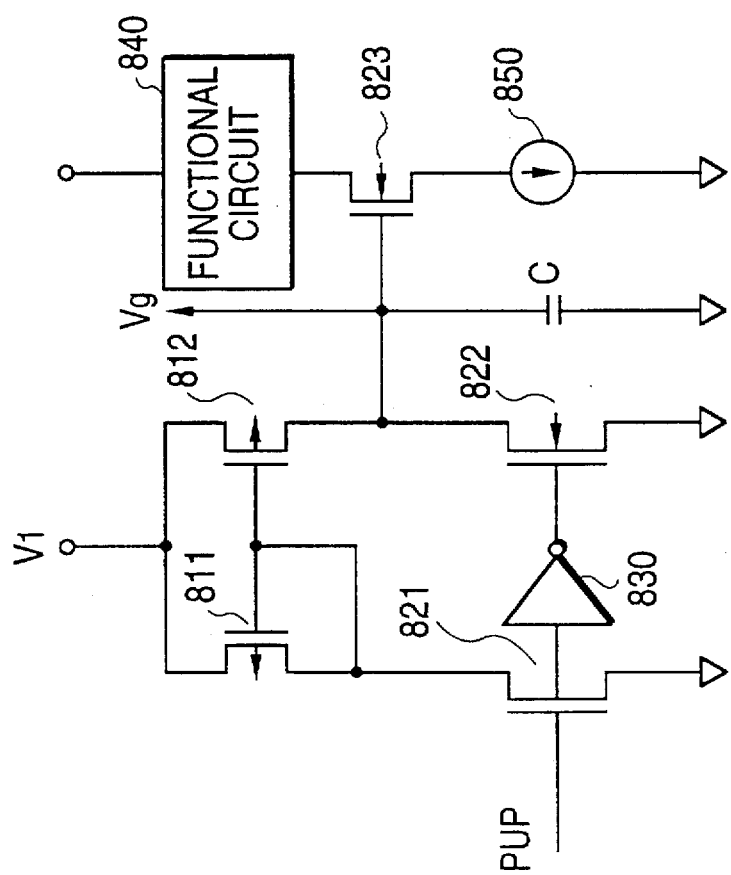
FIG. 8(A) shows a block diagram of a configuration of a current control signal generator.

FIG. 8(A) shows a first example of the circuit which controls the circuit current by using the PUMP signal, and FIG. 8(B) shows operation waveforms.

Numeral 811 and 812 denote PMOS's. Source thereof are connected to a power supply $V_1$, and gates thereof are connected together and to a drain of a PMOS 811. Numerals 821, 822 and 823 denote NMOS's. A drain of the NMOS 821 is connected to the drain of the PMOS 811, a gate thereof is connected to the PUP signal and a source thereof is connected to a reference potential.

A drain of the NMOS 822 is connected to the drain of the PMOS 812, a gate thereof is connected to an output of an inverter 830 and a source thereof is connected to the reference potential. An input of the inverter 830 is connected to the PUP signal.

Numeral 840 denotes an active circuit such as a differential amplifier. It is provided in a functional circuit block such as the data cache 112, the arithmetic and logic unit 140 or the register file 150 (see FIG. 1). A predetermined operation current is supplied from a constant current source 850 through the NMOS 823. An integration capacitor C is connected across the gate of the NMOS 823 and the ground GND.

The PMOS's 811 and 812 and the NMOS's 821 and 823 form a current mirror circuit. As shown in FIG. 8(B), when the PUMP signal rises from the "0" level to the "1" level, a predetermined charge current flows from the PMOS 812 to the capacitor C and the gate voltage Vg of the NMOS 823 and the current i of the circuit 840 gently rise at predetermined slew rates (change rates per unit time) as shown in the middle and bottom of FIG. 8(B). The rise time $t_1$ corresponds to the stage $t_1$ shown in FIG. 7.

Similarly, when the PUMP signal changes from the "1" level to the "0" level, the voltage Vg and the current i gently fall at a predetermined slew rate. The fall time $t_4$ corresponds to the stage $t_4$ shown in FIG. 7.

The rise time $t_1$ and the fall time $t_4$ of the current i are not necessarily equal. The fall time $t_4$ may be short within an inconvenient range because the circuit operation has been terminated.

Figure 9B:
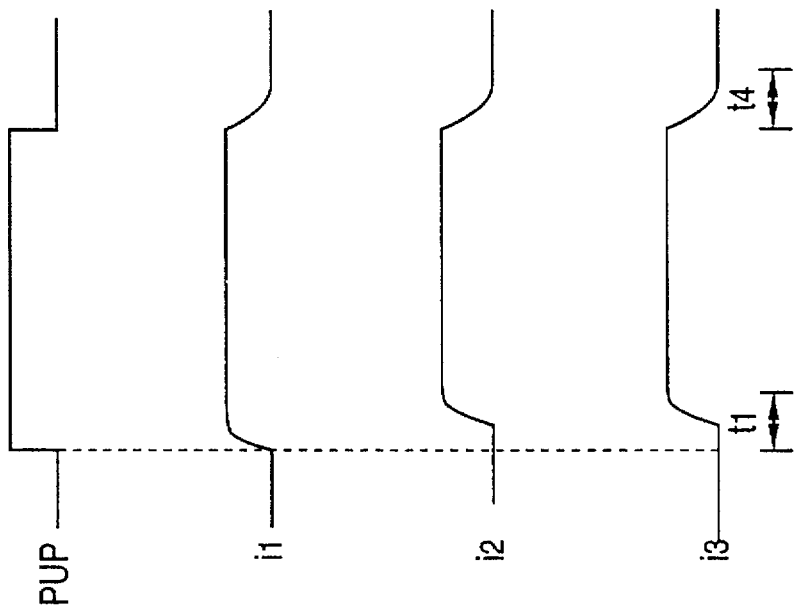
FIG. 9(B) shows a timing chart of an operation thereof.
Figure 9A:
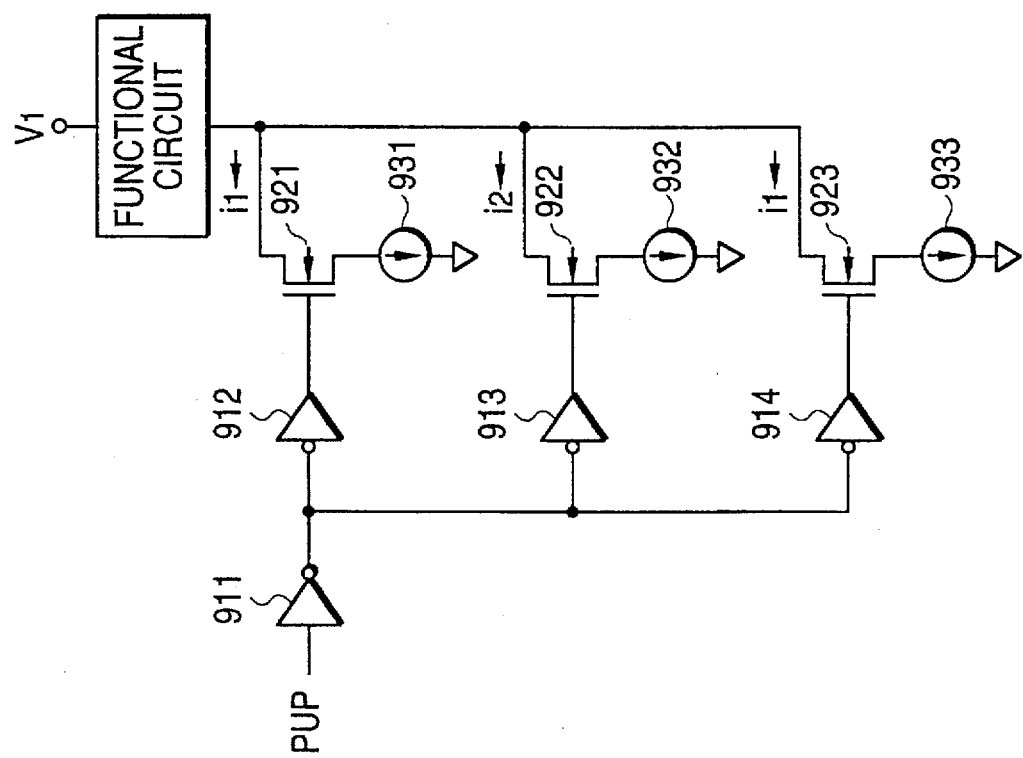
FIG. 9(A) shows a block diagram of a current control signal generator.

FIG. 9(A) shows a second example of the circuit for controlling the circuit current by using the PUP signal, and FIG. 9(B) shows operation waveforms.

Numerals 911 to 914 denote inverters, numerals 921 to 923 denote NMOS's, numerals 931 to 933 denote constant current sources, and numeral 940 denotes an active circuit such as a differential amplifier which is provided in a functional circuit block such as the data cache 112, the arithmetic and logic unit 140 or the register file 150 (see FIG. 1).

The delay times of the inverters 912 to 914 are selected such that they increase in the order of 914, 913 and 912. Thus, when the PUP signal changes from the "0" level to the "1" level as shown in FIG. 9(B), the currents $i_1$ to $i_3$ flowing in the NMOS's 921 to 923 rise with predetermined time lags and the operation current of the active circuit 940 rises stepwise after the time $t_1$ to a steady state current $i_1+i_2+i_3$.

Similarly, when the PUP signal changes from the "1" level to the "1" level, the circuit current 940 falls stepwise in the time $t_4$. In effect, the gentle current change like that in the embodiment of FIG. 8 is attained.

The rise time $t_1$ and the fall time $t_2$ correspond to the stage $t_1$ and the stage $t_4$ of FIG. 7, respectively, as they do in the first embodiment.

In the above embodiments, the circuit current is controlled by using the PUP signal and the φSA signal. Alternatively, the circuit current may be controlled by other conventional methods.

An example of the circuit current control in the data cache memory 112 (see FIG. 1) is explained for the first circuit current control circuit.

Figure 10:
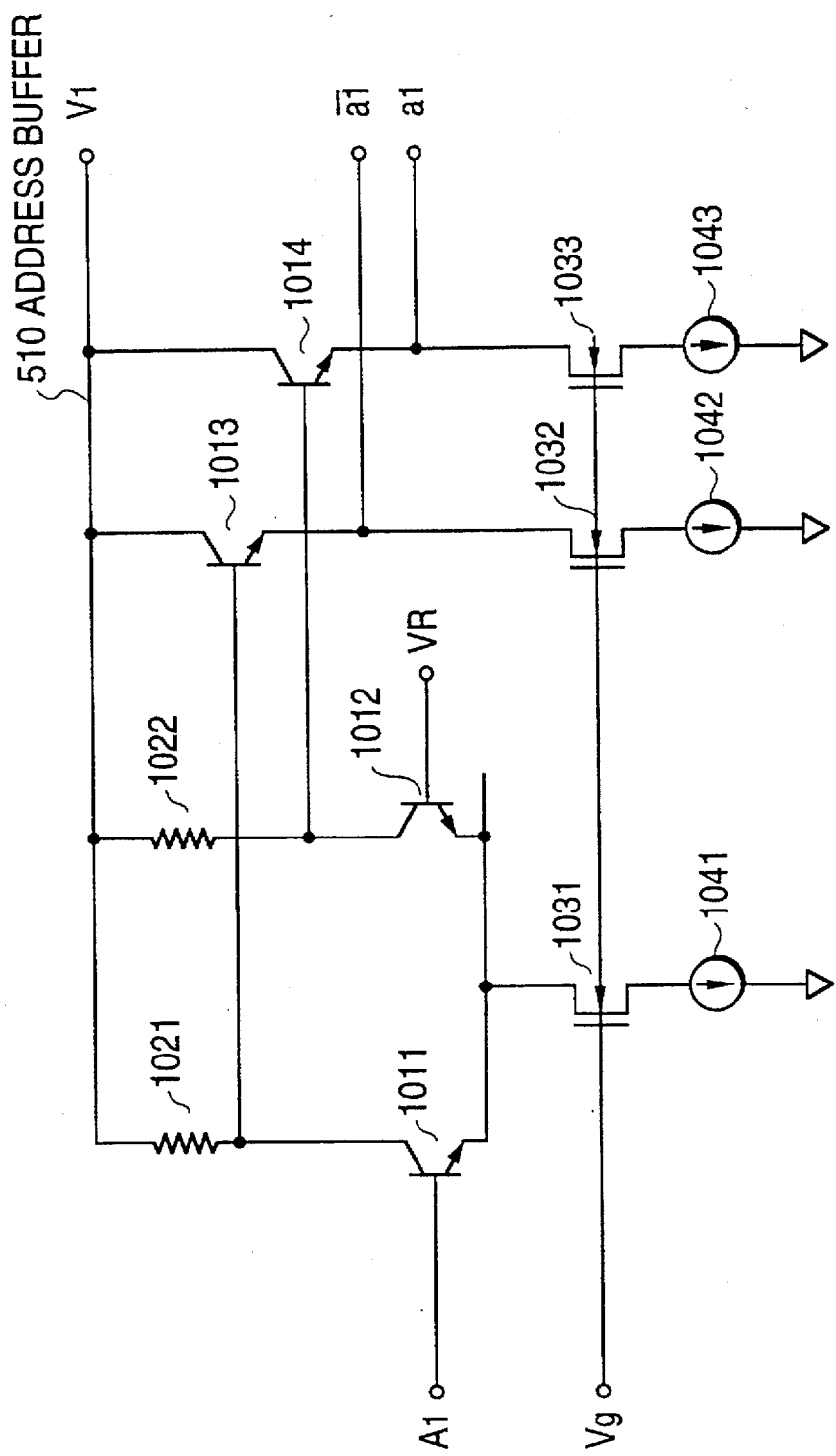
FIG. 10 shows a circuit diagram of an address buffer.

FIG. 10 shows an embodiment of the current control for the address buffer 510 in FIG. 5 of the data cache memory 112.

Numerals 1011 to 1014 denote NPN transistors, numerals 1021 and 1022 denote resistors, numerals 1031 to 1033 denote NMOS's and numerals 1041 to 1043 denote constant current sources.

Emitters of the NPN transistors 1011 and 1012 are connected together and to the constant current source 1041 through the NMOS 1031. Bases of the NPN transistors 1011 and 1012 are connected to an address signal $A_i$ and a reference potential $V_R$, respectively, and collectors thereof are connected to a power supply $V_1$ through the resistors 1021 and 1022. Collectors of the NPN transistors 1013 and 1014 are connected to the power supply $V_1$ and bases thereof are connected to the collector of the NPN 1011 and the collector of the NPN 1012. Emitters of the NPN's 1013 and 1014 are connected to the constant current sources 1042 and 1043 through the NMOS's 1032 and 1033, respectively.

An output $a_i$ is taken out of the emitter of the NPN 1014 as a non-inverted output of the input i, and an output $\bar{a}_i$ is taken out of the emitter of the NPN 1013 as an inverted output of the input $A_i$. The gates of the NMOS's 1031 to 1033 are commonly connected to the control signal Vg, which corresponds to the signal Vg shown in FIG. 8.

The NPN's 1011 and 1012, the resistors 1021 and 1022, and the constant current source 1041 form a differential amplifier. When the current control signal Vg is at the "1" level and the address signal $A_i$ is higher than Vg, the NPN 1011 turns on, the NPN 1012 turns off, the collector of the NPN 1011 is at the "0" level and the collector of the NPN 1012 is at the "1" level.

The collector of the NPN 1011 is connected to the base of the emitter follower transistor 1013 which produces the "0" level output $\bar{a}_i$ at the emitter thereof. Similarly, the collector of the NPN 1012 is connected to the base of the emitter follower transistor 1014 which produces the "1" level output $a_i$ at the emitter thereof.

When the address signal $A_i$ is lower than $V_R$, the NPN 1011 and the NPN 1012 operate in the opposite manner so that the $\bar{a}_i$ output is at the "1" level and the $a_i$ output is at the "0" level.

When the current control signal Vg is at the "0" level, all of the NMOS's 1031 to 1033 are turned off. Since there is no current path from the power supply $V_1$ to the ground GND, the circuit does not consume the power.

Since the current control signal Vg has the predetermined rise and fall times as shown in FIG. 8(B), the change of the current is gentle as shown by 7a in FIG. 7.

Figure 24A:
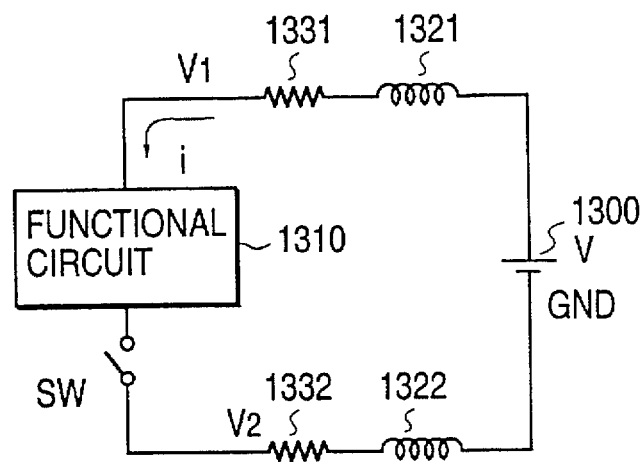
Figure 24B:
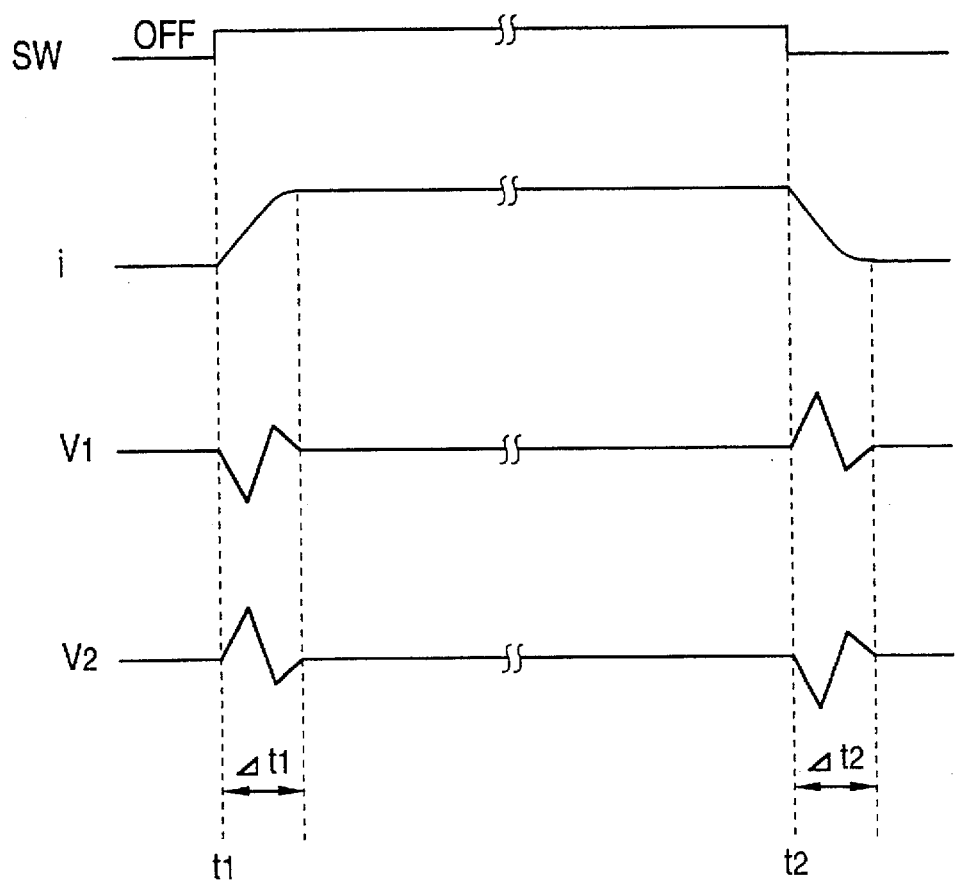

Accordingly, the power supply and ground noises (see FIG. 24(B)) generated in switching the current can be suppressed to a desired level.

Figure 11:
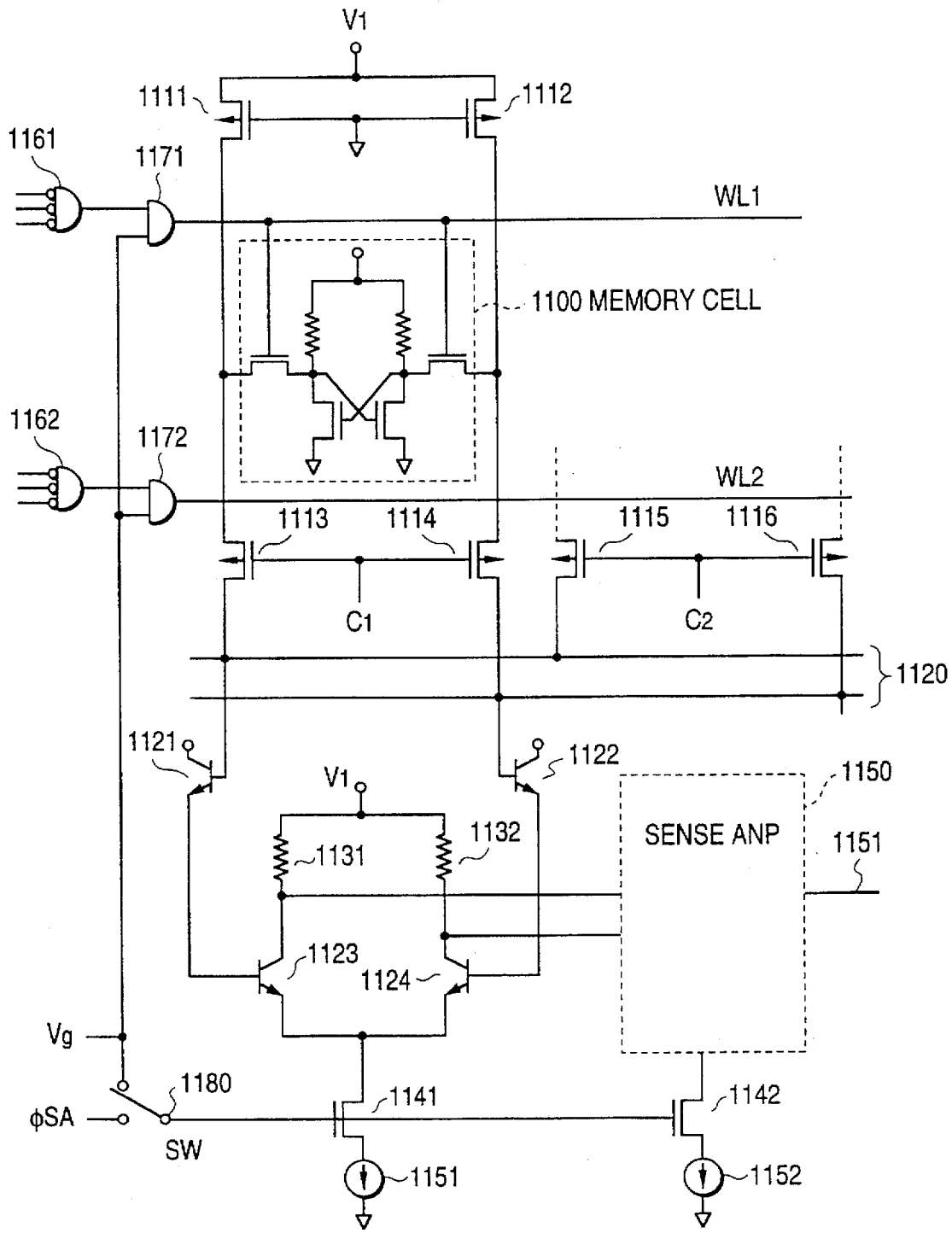
FIG. 11 shows a block diagram of a memory cell peripheral circuit.

FIG. 11 shows an example of the circuit current control for the decoder driver 520, the memory array 530 and the sense amplifier 540 (see FIG. 5) in the data cache memory.

Numerals 1161 and 1162 denote NOR gates which correspond to the final stage of the address decoder.

Numerals 1171 and 1172 denote a word driver comprising AND gates. Outputs of the address decoders 1161 and 1162 are connected to one input, the control signal Vg is connected to the other input, and word lines $WL_1$ and $WL_2$ are driven by the output thereof.

Numeral 1100 denotes a 4-MOS memory cell although it is not restrictive. For the sake of convenience, only one cell is shown.

Numerals 1111 and 1112 denote load MOS's for pulling up bit lines. Numerals 1113 to 1116 denote MOS switches for selecting the bit lines. A desired bit line is connected to a common data line 1120 by column select signals $C_1$ and $C_2$.

Numerals 1121 and 1122 denote emitter follower circuits comprising NPN Transistors. They shift the level of the signal on the common data line 1120 by $V_{BE}$ (base-emitter voltage) and convey them to the bases of the NPN's 1123 and 1124, respectively. Emitters of the NPN's 1123 and 1124 are connected together and to a current source 1151 through an NMOS 1141. Collectors of the NPN's 1123 and 1124 are connected to the power supply $V_1$ through resistors 1131 and 1132.

The NPN's 1123 and 1124, the resistors 1131 and 1132 and the current source 1151 form a differential amplifier which amplifies a small signal read from the memory cell 1100 to a predetermined level. Similarly, numeral 1150 denotes a differential amplifier comprising two resistors and two NPN's, and it is connected to a constant current source 1152 through an NMOS 1142.

Two inputs of the amplifier 1150 are connected to the collectors of the NPN's 1123 and 1124. The signals thereto are amplified to produce an output signal of a predetermined amplitude at a terminal 1151.

The current control signal $V_g$ (see FIG. 8) is connected to one input of each of the AND gates 1171 and 1172. Thus, when $V_g$ is at the "1" level, the AND gates 1171 and 1172 are selectively driven to selectively drive the word lines $WL_1$ and $WL_2$. On the other hand, when $V_g$ is at the "0" level, the word drivers including the AND gates 1171 and 1172 are turned off. Accordingly, the currents flowing into any memory cells including the memory cell 1000 are blocked. As a result, wasteful power consumption in the non-access state of the memory is saved.

Similarly, the current control signal $V_g$ is connected to the gates of the NMOS's 1141 and 1142, when $V_g$ is at the "1" level, the NMOS's 1141 and 1142 are turned on, and when $V_g$ is at the "0" level, they are turned off.

Accordingly, in the non-access mode of the memory, no current flows in the sense amplifier and wasteful power consumption is saved.

The change in the circuit current by the current control signal $V_g$ is shown by 7a in FIG. 7. Thus, the power supply and ground noises due to the current switching can be suppressed to the allowable level and a high speed operation is attained because the noises disappear at the start time of the memory accessing.

In FIG. 11, when the switch SW 1180 is switched to the position of the signal $\phi$SA, the NMOS's 1141 and 1142 are activated for a short period. As described above, the signal $\phi$SA is a pulse signal which assumes the "1" level only for the predetermined time of the memory access stages $t_2$ and $t_3$. In the present embodiment, it supplies the power to the sense amplifier only for the predetermined time during the memory accessing. Accordingly, the power consumption is saved.

Figure 12:
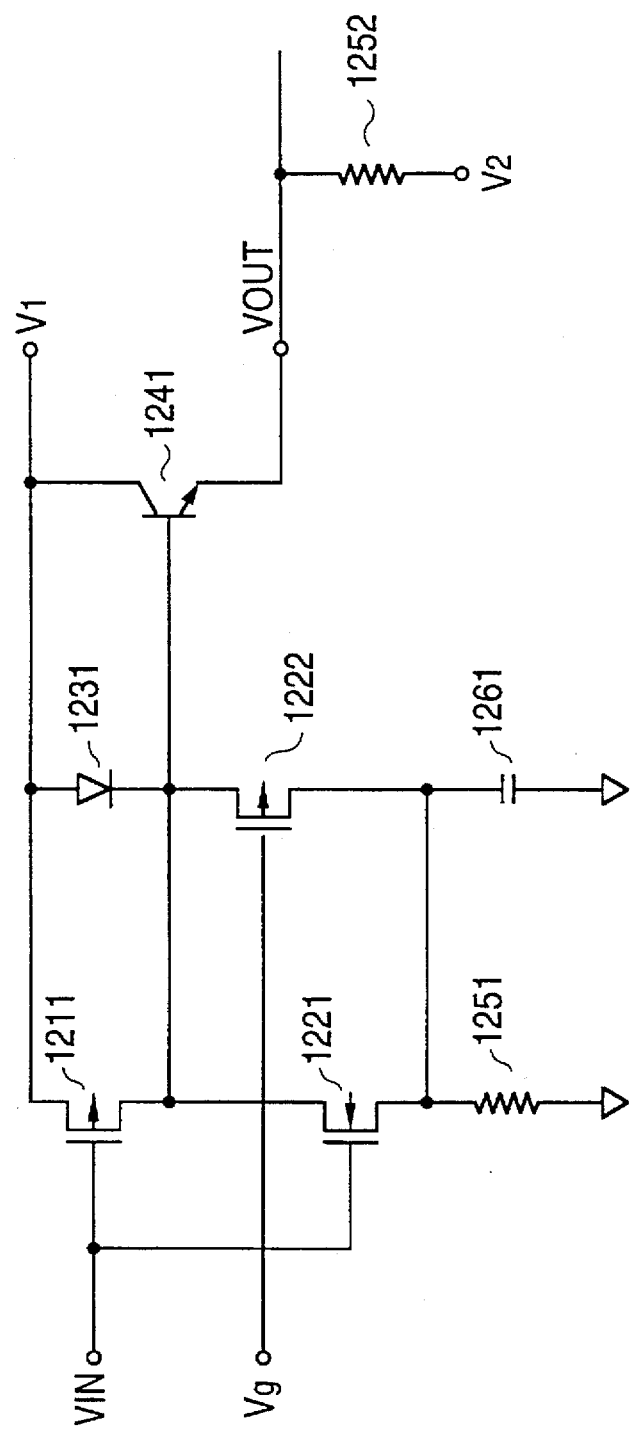
FIG. 12 shows a circuit diagram of an output driver.

FIG. 12 shows an example of the circuit current control for the output driver 550 (see FIG. 5) of the data cache memory 112.

Drain, gate and source of a PMOS 1211 are connected to a base of an NPN 1241, an input $V_{IN}$ and a power supply $V_1$, respectively. Drain, gate and source of an NMOS 1221 are connected to the base of the NPN 1241, the input $V_{IN}$ and one end of a resistor 1251, respectively. Drain, gate and source of a PMOS 1222 are connected to the drain of the NMOS 1221, a current control signal $V_g$ and the base of the NPN 1241, respectively. A capacitor 1261 is connected across the resistor 1251. Anode and cathode of a diode 1231 are connected to the collector and the base of the NPN 1241, and the power supply $V_1$ is connected to the collector of the NPN 1241. The emitter of the NPN 1241 is an output terminal and a terminating resistor 1252 is connected across the output terminal and the power supply $V_2$.

When the current control signal $V_g$ is at the "1" level, the PMOS 1222 is turned off. If the input $V_{IN}$ is at the "0" level, the PMOS 1211 is turned on and the NMOS 1221 is turned off. Accordingly, the base voltage of the NPN 1241 is raised through the PMOS 1211 and the output $V_{out}$ assumes the "1" level. On the other hand, when $V_{IN}$ is at the "1" level, the PMOS 1211 is turned off and the NMOS 1221 is turned on. Thus, the base voltage of the NPN 1241 is dropped and the output $V_{out}$ assumes the "0" level.

The diode 1231 serves as a clamper to suppress the drop of the base potential of the NPN 1241 within a predetermined level.

The resistor 1251 is a current limiting resistor, and the capacitor 1261 is a speed-up capacitor.

When $V_g$ is at the "0" level, the PMOS 1222 is turned on. The base potential of the NPN 1241 is dropped without regard to the level of the input $V_{IN}$ so that the output $V_{out}$ assumes the "0" level. Accordingly, the collector current of the NPN 1241 is smaller than that when $V_{out}$ is at the "1" level and the power consumption is saved.

Accordingly, the same effect as those of the circuit current controls for the address buffer 510, the decoder driver 520, the memory array 530 and the sense amplifier 540 is attained.

The circuit current control in the data cache memory 112 (see FIG. 1) has been described above for the first circuit current controller, although the second circuit current controller (see FIG. 9) or other circuit current controller may be used.

In the present embodiment, the power consumption reduction by the memory accessing using the access previous notice signal has been described. The present intention is equally applicable to any functional circuit whose operation is controlled by decoding the instruction word, such as an arithmetic and logic unit in a single chip MPU or a register file. In the present embodiment, the circuit current is raised in synchronism with the stage which is prior to the execution stage of the operation. The synchronization is not always necessary but the rise may be started earlier than the start of the execution stage by a time sufficient to suppress the power supply and ground line noises due to the current change to the predetermined level. In this case, the PUP signal may be rendered effective at a desired timing instead of in synchronism with the stage which is prior to the execution stage.

In the present embodiment, the memory circuit and other functional circuits included in the single chip microprocessor have the circuit current raised before the start of operation at the predetermind rate by the access previous notice signal which is generated prior to the actual operation of the circuit. Accordingly, those functional circuits consume the power necessary for the circuit performance only during the actual operation. In this manner, the power consumption of the single chip microprocessor is reduced.

Since a new function may be added in accordance with the power consumption saving, highly functional and highly integrated device can be attained.

Since the circuit current of the functional circuit is changed at the predetermined rate, the power supply and ground line noises due to the current change can be suppressed to the predetermined level. As a result, a highly reliable circuit operation is attained.

In the functional circuit in accordance with the present embodiment, the power supply and ground line noises have disappeared at the time of the start of actual operation, the circuit can be operated at a best power supply condition and the high speed operation of the circuit is attained.

An application of the present invention to a super scalar RISC processor is now explained.

In the super scalar RISC processor, a plurality of arithmetic and logic units which share a register file are provided, and instructions are simplified to reduce the number of pipeline stages, and a plurality of instructions are fetched in one machine cycle to control the plurality of arithmetic and logic units. Namely, a plurality of instructions are parallelly fetched and executed in one machine cycle and a plurality of arithmetic and logic units are parallelly operated to enhance the processing performance.

FIG. 13 shows a list of instructions of a processor explained in the second embodiment. The instructions are classified into basic instructions, branch instructions, load/store instructions and system control instructions. For the convenience of explanation and simplification, the number of instructions is limited although more instructions may be used.

Figure 14:
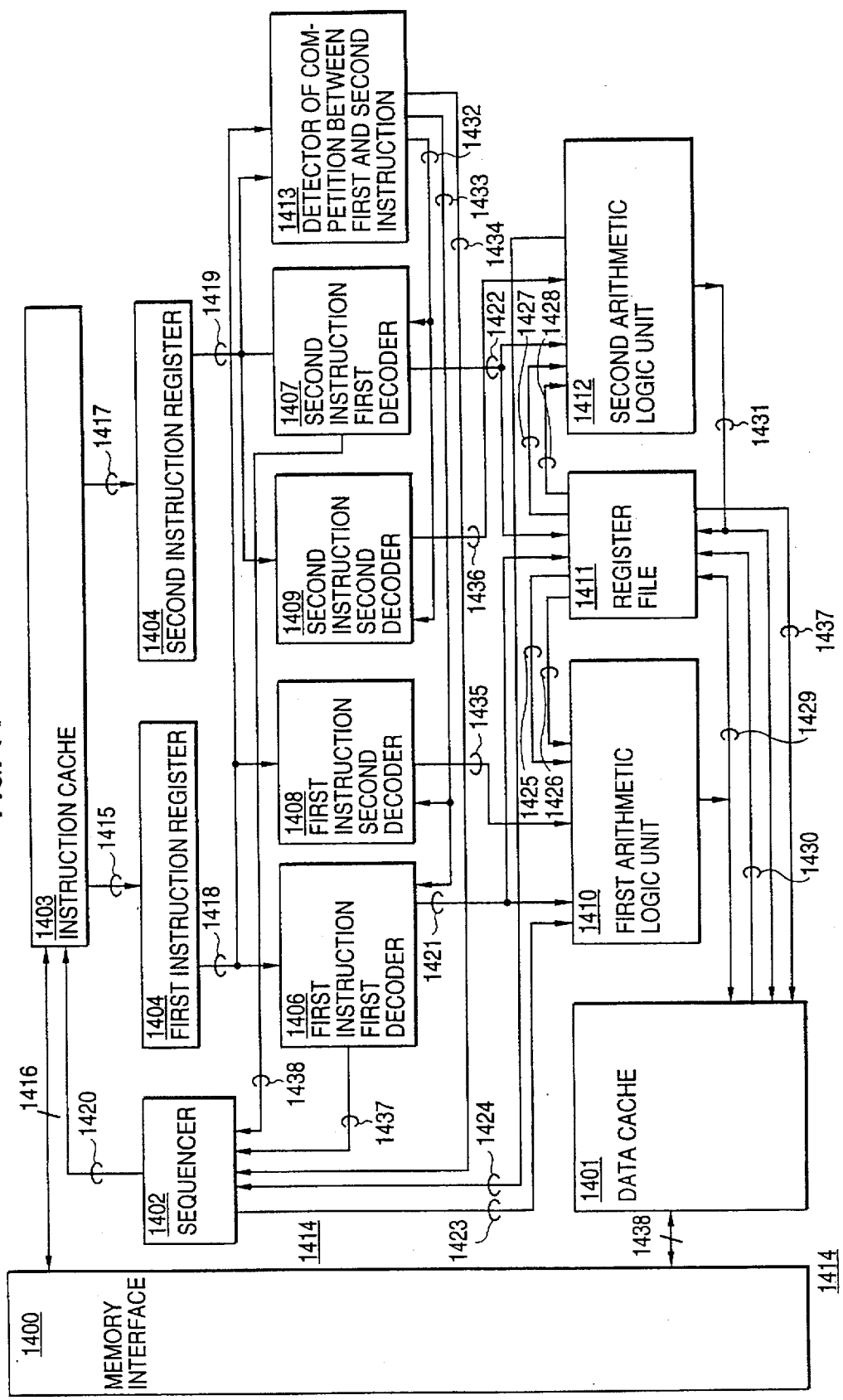
FIG. 14 shows a block diagram of a configuration of a microprocessor in accordance with a second embodiment.
Figure 15:
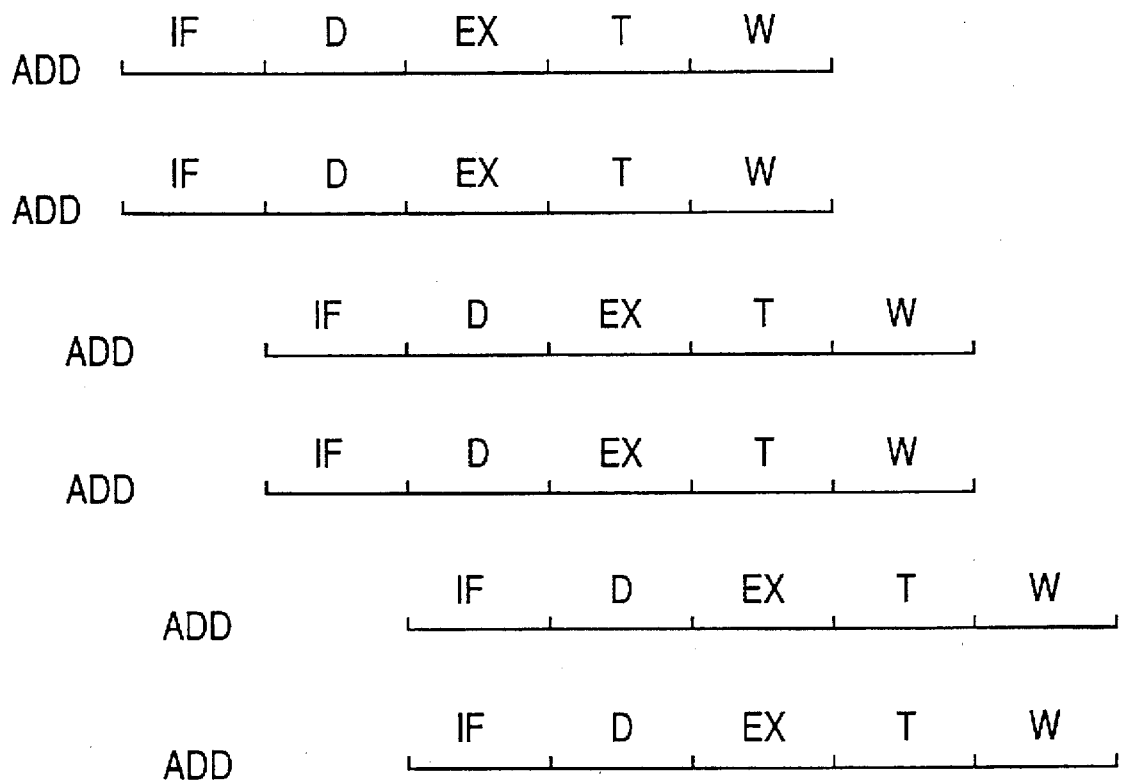
FIG. 15 shows an instruction execution stage of the microprocessor of the second embodiment.

FIG. 14 shows a configuration of the second embodiment. Numeral 1400 denotes a memory interface, numeral 1401 denotes a data cache, numeral 1402 denotes a sequencer, numeral 1403 denotes an instruction cache, numeral 1404 denotes a first 32-bit instruction register, numeral 1405 denotes a second 32-bit instruction register, numeral 1406 denotes a first decoder for a first instruction, numeral 1408 denotes a second decoder for the first instruction, numeral 1409 denotes a second decoder for a second instruction, and numeral 1407 denotes a first decoder for the second instruction. The first and second decoders 1408 and 1409 may have the same function as that of the second instruction decoder 130 explained in the first embodiment (FIG. 1), that is, the function to generate the start previous notice, signal for the operation of the functional circuit block, although the explanation thereof is omitted. Numeral 1413 denotes a competition detector for detecting competition between the first and second instructions, numeral 1410 denotes a first arithmetic and logic unit, numeral 1412 denotes a second arithmetic and logic unit, and numeral 1411 denotes a register file. In the present embodiment, up to two instructions are parallelly fetched and executed in one machine cycle. A most basic operation of the pipeline processing of the present embodiment is shown in FIG. 15. The pipeline comprises five stages, IF (instruction fetch), D (decode), EX (execution), T (test) and W (write).

An operation is explained with reference to FIG. 14. In the IF stage, two instructions designated by a program counter in the sequencer 1402 are fetched from the instruction cache 1403 and they are set into the first instruction register 1404 and the second instruction register 1405 through buses 1415 and 1417, respectively.

In the D stage, the content of the first instruction register 1404 is decoded by the first decoder 1406, and the content of the second instruction decoder 1405 is decoded by the second decoder 1407. As a result, the content of the register designated by the first source register field of the first instruction register 1404 is sent to the first arithmetic and logic unit 1410 through a bus 1425, and the content of the register designated by the second source register field is sent to the first arithmetic and logic unit 1410 through a bus 1426. The content of the register designated by the first source register of the second instruction register and the content of the register designated by the second source register field are sent to the second arithmetic and logic unit 1412 through a bus 1427 and a bus 1428, respectively.

The operation in the EX stage is now explained. In the EX stage, the first arithmetic and logic unit 1410 processes the data sent through the buses 1425 and 1426 in accordance with the operation code of the first instruction register. In parallel thereto, the second arithmetic and logic unit 1412 processes the data sent through the buses 1427 and 1428 in accordance with the operation code of the second instruction register 1405. For the LOAD/STORE instruction, the address calculation is effected.

An operation in the T stage is now explained. In the T stage, the basic information continues to hold the data. The LOAD/STORE instruction executes, in, this stage, the memory accessing to the data cache 1401 based on the address supplied through the bus 1429 or 1431 calculated in the previous EX stage. For the STORE instruction, the data to be simultaneously stored is supplied through the bus 1437.

Finally, an operation in the W stage is explained. In the W stage, the operation result of the first arithmetic and logic unit 1410 is stored into the register designated by the destination field of the first instruction register, through the bus 1429. The operation result of the second arithmetic and logic unit 1412 is stored into the register designated by the destination field of the second instruction register, through the bus 1431. For the LOAD instruction, it is stored into the register designated by the destination field in the LOAD instruction, through the bus 1430.

FIG. 15 shows a flow of requentially executing the basic instructions. Two instructions are executed in one machine cycle. In the present example, the first arithmetic and logic unit and the second arithmetic and logic unit always operate in parallel.

However, depending on a combination of the first instruction and the second instruction, there may be a case where both instructions cannot be parallelly executed. This is called competition.

For example, the competition occurs when the register designated by the destination register field of the first instruction and the register designated by the first source register field of the second instruction or the register designated by the second source register field of the second instruction are same.

Figure 16:
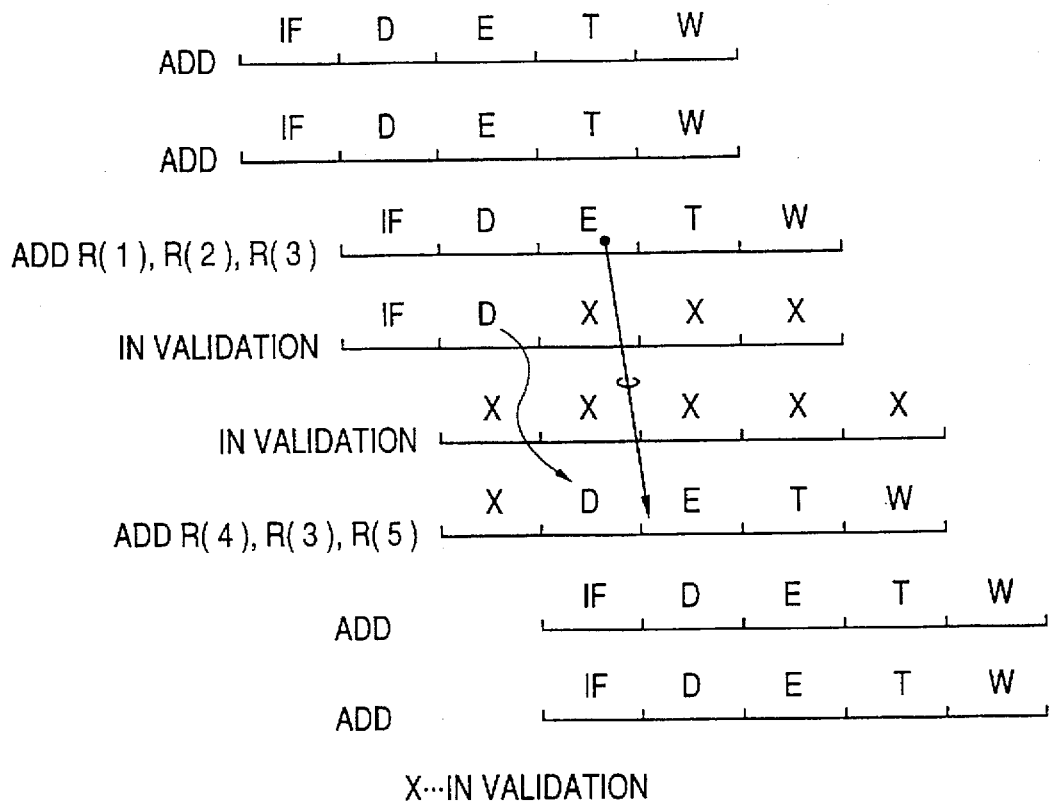
FIG. 16 shows an instruction execution stage of the microprocessor when competition occurs.

When such a competition occurs, the hardware is controlled to execute the instruction stored in the first instruction register in one machine cycle and execute the instruction in the second instruction register in the next one machine cycle. Namely, the first instruction and the second instruction are executed in one machine cycle, respectively. FIG. 16 shows a pipeline when the competition occurs. In the present example, both the first instruction and the second instruction are ADD instructions. For the two instructions at the address 2, the first instruction is to add the contents of the register R(1) and the register R(2) and store the seem into the register R(3), and the second instruction is to add the contents of the register R(4) and the register R(3) and store the sum into the register R(5). The destination register R(3) of the first instruction competes to the source register R(3) of the second instruction. In such a case, the instructions are executed one in one machine cycle, as shown in FIG. 16.

Namely, the first instruction is executed and the parallel second instruction is invalidated in PC2. In the next cycle, the first instruction is invalidated and the parallel second instruction is executed. The competition which occurs between the destination and the source when the executions are staggered by one cycle may be solved by a well-known short path.

As shown in FIG. 14, the super scalar RISC processor has two arithmetic and logic units. When the competition occurs, only one of the arithmetic and logic units can be used, and the remaining arithmetic and logic unit operates in a non-significant manner.

In the super scalar RISC processor, when the competition is detected, it is important to detect and activate one of the arithmetic and logic units to be used prior to the start of operation. This is explained with reference to FIG. 14. After the first instruction and the second instruction have been fetched in the IF stage, the competition between the first instruction and the second instruction is checked by the competition detection 1413 in the D stage.

If the competition is detected by the competition check, only one of the arithmetic and logic units is operated. Thus, the unit to be used is activated by the signals 1432 and 1433.

If there is no competition, both arithmetic and logic units are activated. If a control signal for the next machine cycle informs the activation in a latter half of the current machine cycle, the activated arithmetic and logic unit in kept activated. If the control signal does not informs the activation, the arithmetic and logic unit is inactivated at the end of the current machine cycle.

The operation when the competition occurs is explained in detail. When the competition detector detects the competition between the first and second instructions, the first arithmetic and logic unit is informed of the activation by the control signal 1435 through the bus 1433 in order to execute the first instruction first, and it is activated. At the same time, the second arithmetic and logic unit is informed of the non-activation by the control signal 1436 through the bus 1432. Thus, the second arithmetic and logic unit is kept inactivated, that is, in the low power consumption state.

The signal 1434 informs the detection of the competition to the sequencer 1402.

In the next cycle, the first arithmetic and logic unit is informed of the non-activation by the control signal 1435 through the bus 1433 in order for the second instruction to be executed. As a result, the first arithmetic and logic unit is inactivated. At the same time, the second arithmetic and logic unit is informed of the activation by the control signal 1436 through the bus 1432.

In the present embodiment, when the competition is detected in the two-instruction parallel execution system, the arithmetic and logic unit to be used is detected and activated prior to the start of operation so that the inactivated arithmetic and logic unit is kept in the low power consumption state and the overall power consumption is suppressed.

Figure 17:
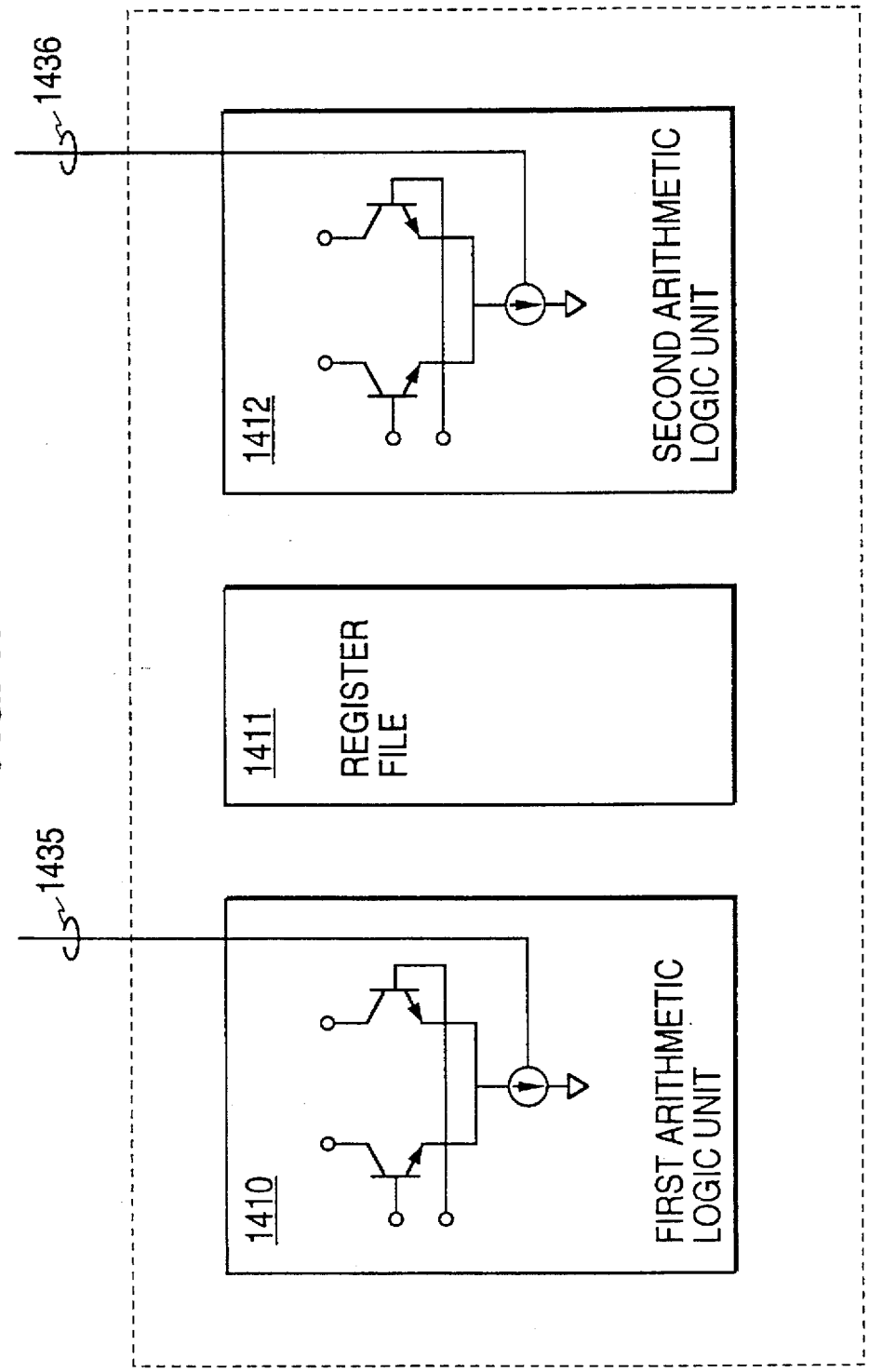
FIG. 17 shows a circuit in an arithmetic and logic unit.
Figure 18:
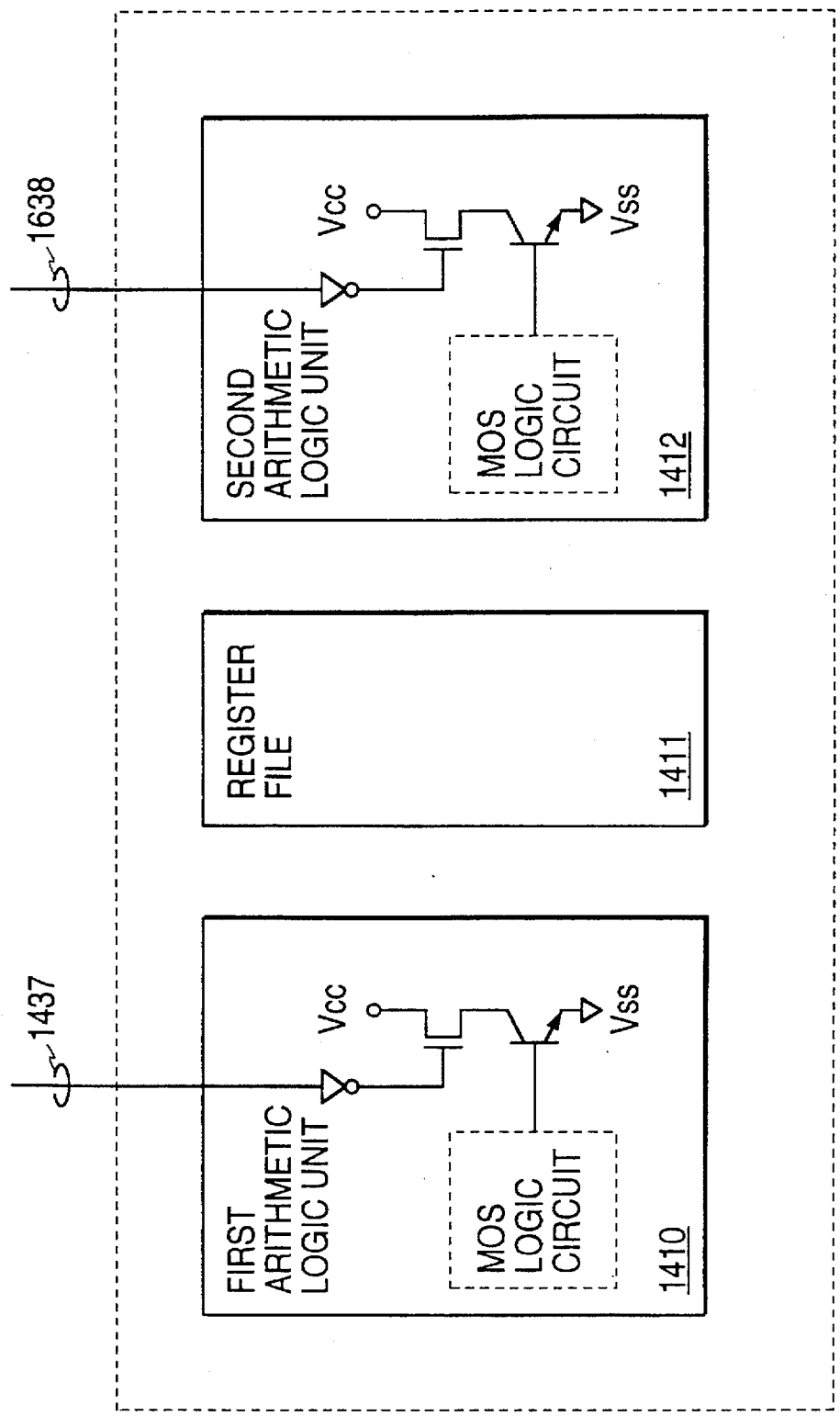
FIG. 18 shows another circuit in the arithmetic and logic unit.
Figure 19:
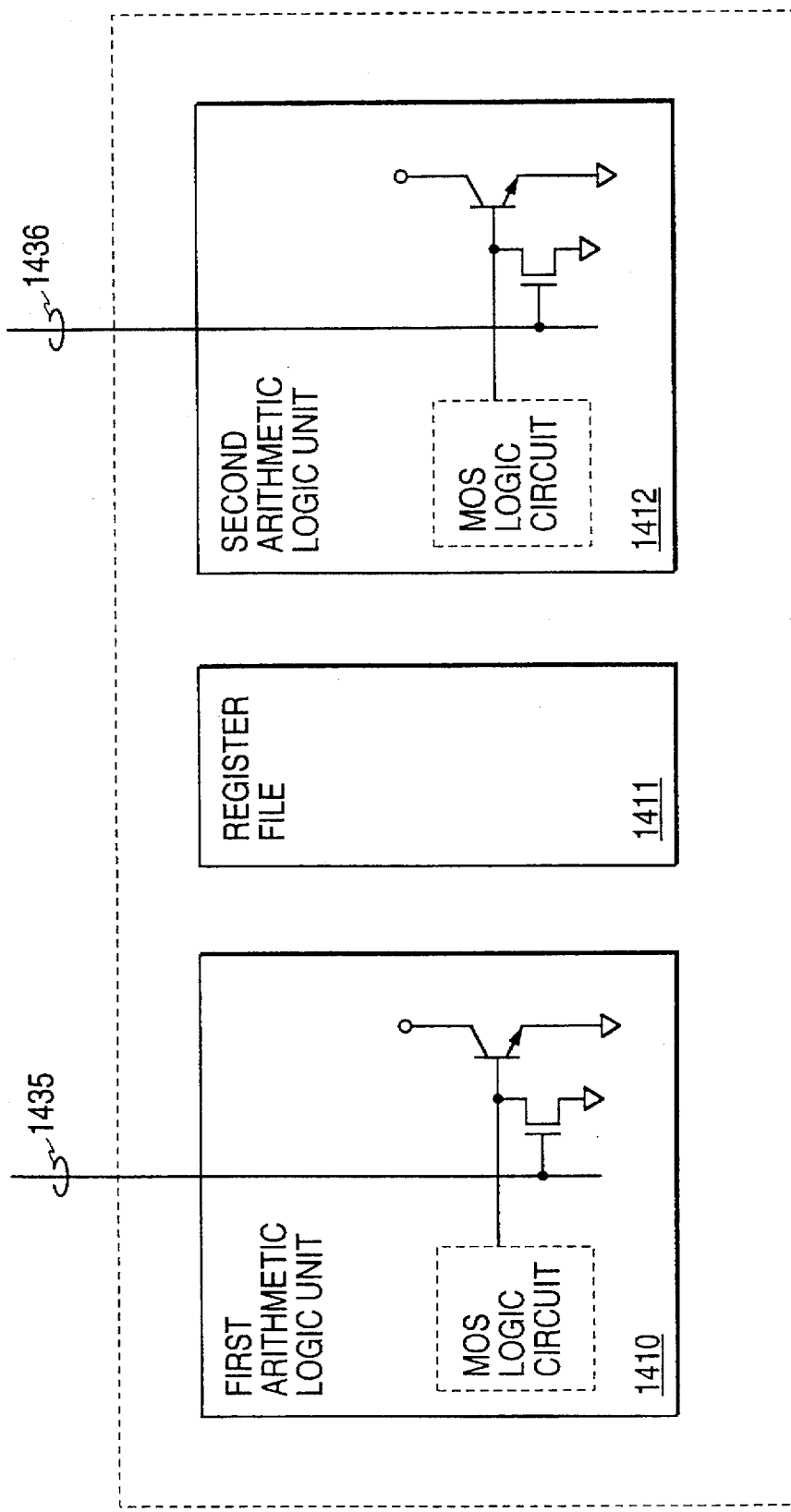
FIG. 19 shows other circuit in the arithmetic and logic unit.

FIGS. 17 to 19 show the first arithmetic and logic unit 1410, the second arithmetic and logic unit 1412 and the register file 1411 of FIG. 14. The connections are omitted.

In FIG. 17, each of the first and second arithmetic and logic units uses at least one differential input circuit, for example, an ECL circuit. When the competition is detected in the super scalar microprocessor having such an arithmetic and logic unit, the instructions are executed one in one machine cycle. Thus, the first or second arithmetic and logic unit which is actually operated is activated through the signal line 1435 or 1436 and a predetermined current is flown from the current source in order to attain the intended operation, but in the remaining inactivated arithmetic and logic unit, the current from the current source is reduced or blocked. Thus, the power consumption is reduced.

Figure 20:
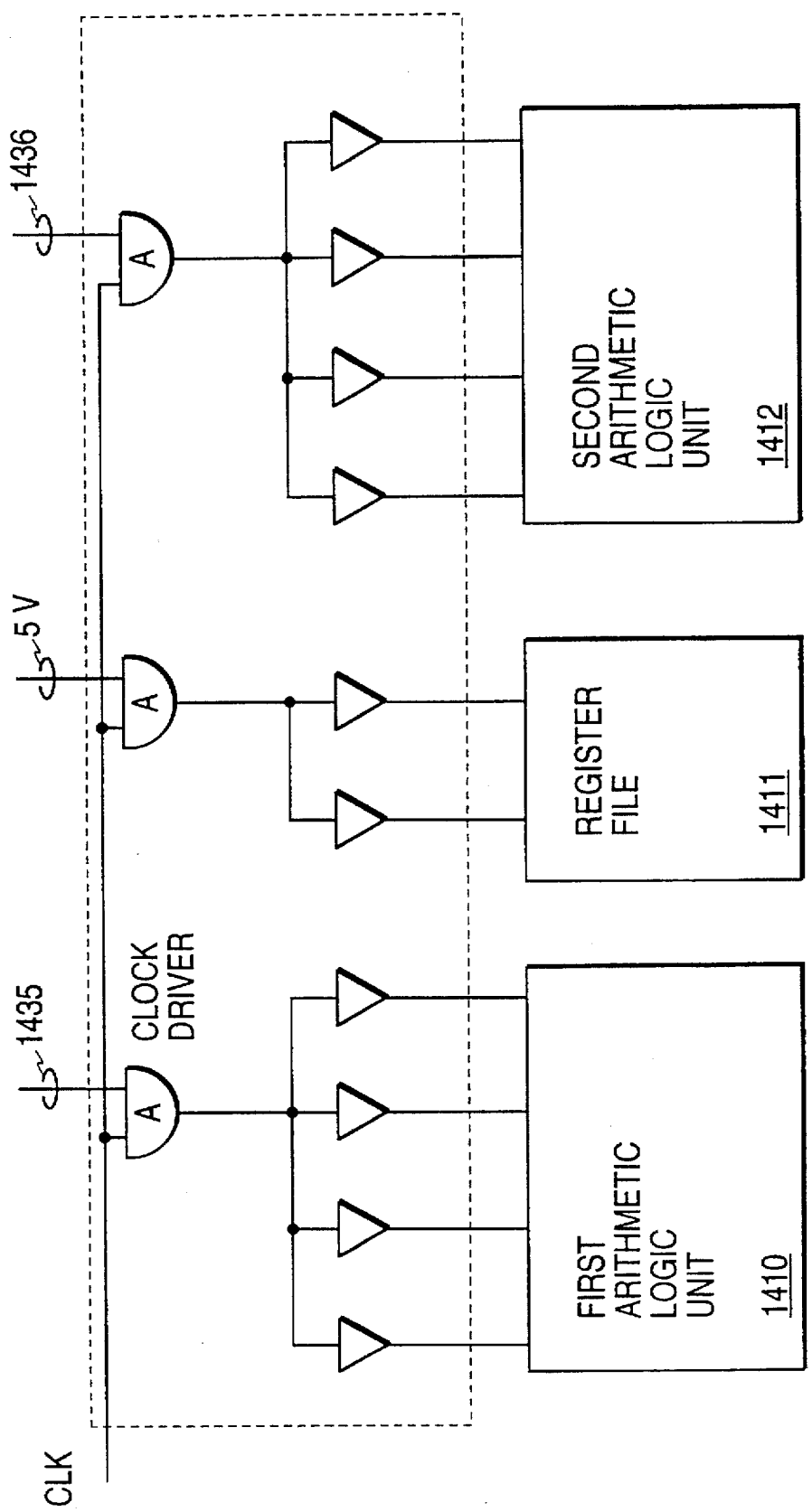
FIG. 20 shows a further circuit in the arithmetic and logic unit.

In FIGS. 18, 19 and 20, each of the first and second arithmetic and logic units has at least one bipolar transistor base-emitter logic circuit, for example, an ECL circuit or a BiMOS circuit. The circuit configuration is shown in detail in JP-A-60-175167. This circuit has a drawback in that a DC current flows and power consumption increases when the bipolar transistor conducts. Accordingly, it is effective to block the power consumption of the non-operated arithmetic and logic unit when the competition occurs. The control method may be same as that explained in FIG. 17.

FIGS. 18 and 19 differ in the manner of power consumption saving. In FIG. 18, a P-channel MOS is inserted between a collector of a bipolar transistor and Vcc. The circuit is activated when the P-channel MOS transistor is turned on, and inactivated when it is turned off.

In FIG. 19, the circuit is maintained in the operation state but when a signal 1435 or 1436 is turned on, a bipolar transistor is forcebly turned off to block a collector-emitter current of the bipolar transistor. This means the forecibe block of the DC current. In this manner, the power consumption is saved.

FIG. 20 shows the first arithmetic and logic unit 1410, the second arithmetic and logic unit 1412, the register file 1411 and the clock distribution circuit of FIG. 14. A clock driver A in the distribution circuit of FIG. 20 should be noticed.

The clock driver A independently supplies the clock only to the first arithmetic and logic unit 1410, the register file 1411 and the second arithmetic and logic unit 1412. In the super scalar microprocessor comprising the arithmetic and logic units including such a distribution circuit, when the competition is detected, the instructions are executed one in one machine cycle. The first or second arithmetic and logic unit which is not actually used controls to stop the delivery of the clock to a specific area of the clock distribution circuit through the signal line 1435 or 1436. As a result, the logics downstream of the clock distribution circuit are fixed. Namely, one of the two arithmetic and logic units is supplied with the clock and operates but the remaining arithmetic and logic unit is not supplied with the clock.

The CMOS circuit or the BiMOS basic circuit has a complementary characteristic and its normal power consumption is very small but it consumes the power at a transition time when input data changes. The non-supply of the clock means that the logics are fixed and do not change. As a result, the power consumption is saved. The control method of FIG. 20 is effective to the arithmetic and logic unit including the CMOS circuit or the BiMOS basic circuit.

As described above in connection with FIGS. 17 to 20, the power consumption in the inactivated mode can be saved in accordance with the circuit configuration of the arithmetic and logic circuit. It is also apparent that the power consumption can be saved in the configuration of the arithmetic and logic unit which is a combination of the circuits of FIGS. 17 and 18.

In the present embodiment, the competition between the registers has been discussed. Other competition may include a case where the parallel execution is inhibited by a combination of instructions (for example, a combination of the LOAD instruction and the LOAD instruction). An example of the combination is shown in FIG. 21. However, such a combination is determined by the implementation of the hardware and it has no direct connection with the present invention. In FIG. 21, if there is a restriction in one or more combination, it means that the competition by the combination of instructions has occurred.

Turning back to FIG. 14, other operation of the competition detector 1413 and the decoders 1406, 1408, 1409 and 1407 is explained as a third embodiment.

In the previous embodiments, when the competition is detected, the arithmetic and logic unit to be operated is detected and activated prior to the start of operation. In the third embodiment, when the competition is detected, the arithmetic and logic unit which is not to be operated is detected and inactivated prior to the start of operation. This is explained in detail with reference to FIG. 14. After the first instruction and the second instruction have been fetched in the IF stage, the competition between the first instruction and the second instruction is checked by the competition detector 1413 in the D stage. When the competition is detected, only one arithmetic and logic unit executes the instruction and the remaining arithmetic and logic unit may be inactivated by the signal 1432 or 1433. Namely, when the competition detector detects the competition between the first instruction and the second instruction, the first instruction is executed first, and the second instruction invalidates the first decoder for the second instruction by the signal 1432 and inactivates the second arithmetic and logic unit by the control signal 1436. The signal 1434 informs the detection of the competition to the sequencer 1402. In the next cycle, the first decoder for the first instruction is invalidated by the output 1433 of the competition detector, and the first arithmetic and logic unit is inactivated by the control signal 1435. In parallel thereto, the second instruction is executed. The inactivated arithmetic and logic unit is again activated in the latter half of the machine cycle so that it can execute the succeeding instruction.

In accordance with the present embodiment, in the two instruction parallel execution system, any competition between two instructions which may be parallelly executed is checked, and if it is detected, the arithmetic and logic unit which is not operated is inactivated to reduce the overall power consumption.

FIGS. 17 to 19 show the first arithmetic and logic unit 1410, the second arithmetic and logic unit 1412 and the register file 1411 of FIG. 14. The connections are omitted. The manner of power saving of the arithmetic and logic units is same as that of the second embodiment.

In the super scalar microprocessor having such arithmetic and logic units, when the competition is detected, the instructions are executed one in one machine cycle, and the power consumption in the first or second arithmetic and logic unit which is not actually operated is saved by the signal 1435 or 1436. The first or second arithmetic and logic unit which is actually operated continues to flow the current required for the intended function from the current source. Thus, the predetermined current flows through one of the units while the other unit saves the power consumption.

It is apparent that the power consumption can be saved in the arithmetic and logic unit which is a combination of the circuits of FIGS. 17 and 18, as is done in the second embodiment.

In the present embodiment, the competition between the registers has been discussed. Other competition may include a case where the parallel execution is inhibited by a combination of instruction (for example, a combination of the LOAD instruction and the LOAD instruction), as mentioned in the second embodiment. FIG. 21 shows an example of the combination. However, the combination is determined by the implementation of the hardware and it has no direct connection with the present invention, as mentioned in the second embodiment. In FIG. 21, when there is a restriction in one or more combination, it means that the competition by the combination of instructions has occurred.

Figure 22:
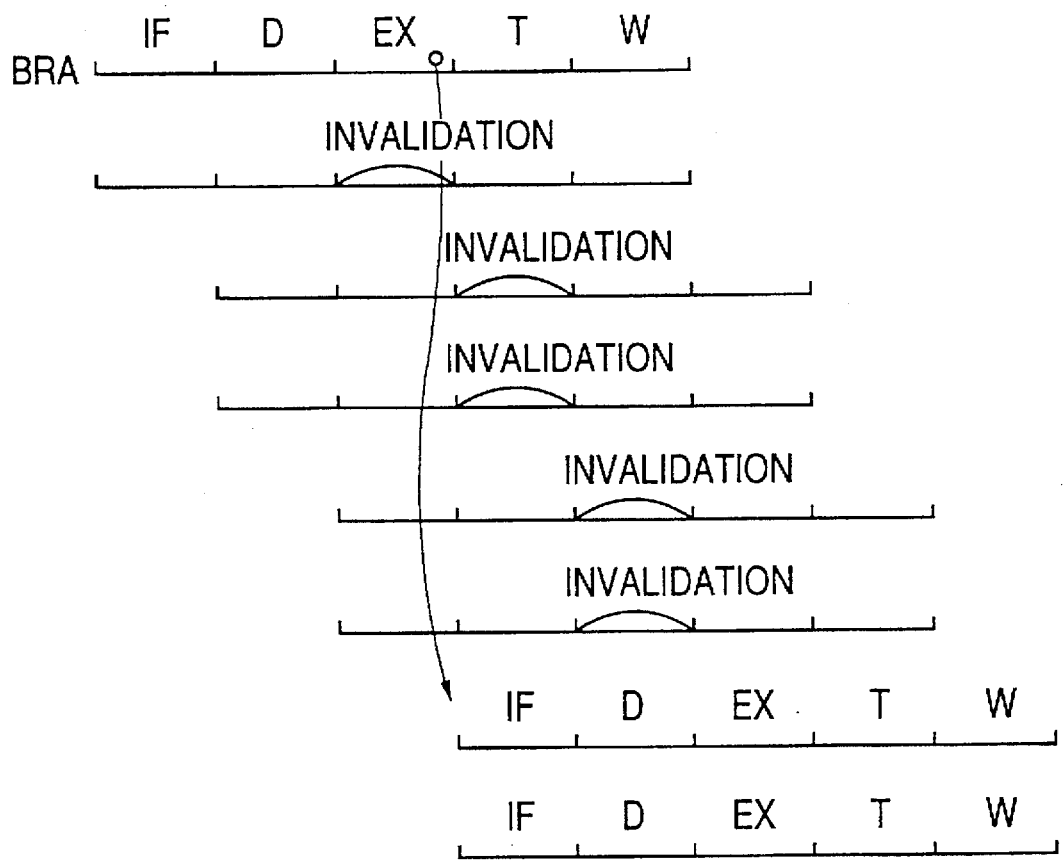
FIG. 22 shows an instruction execution stage for a branch instruction.
Figure 23:
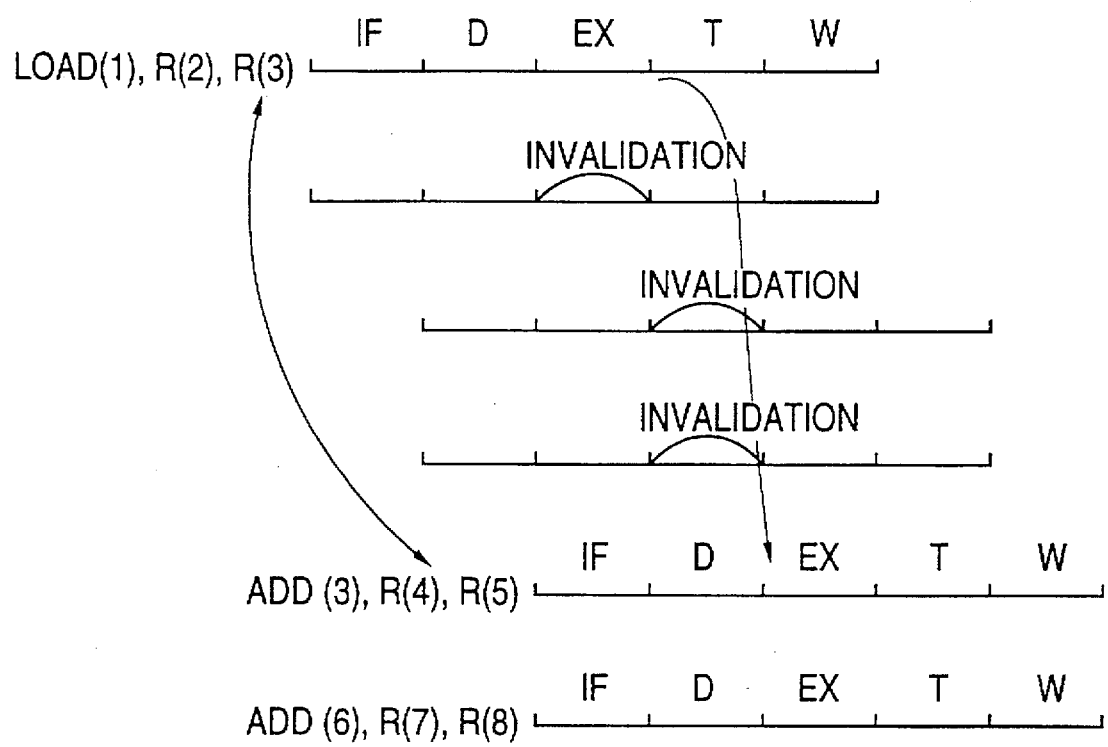
FIG. 23 shows an instruction execution stage in a load use mode, and FIG. 24(A) and 24 (B) illustrate a relation between a change in a circuit current and a noise voltage.

In the present embodiment, the combination of basic instructions has been discussed. The arithmetic and logic unit may also operate in a non-significant manner when data loaded by an instruction immediately following to a branch or load instruction is used. (It is called load use.) The present invention is also effective to such a case FIG. 22 shows an example for a branch instruction, and FIG. 23 shows an example for the load use. The operations may be easily understood and hence the explanation is omitted.

When an instruction by which the arithmetic and logic unit is not actually operated such as a NOP instruction or system control instruction is detected, the arithmetic and logic unit for the detected instruction may be inactivated.

In FIG. 14, the second decoder 1408 for the first instruction and the second decoder 1409 for the second instruction decode the instructions to determine whether the instructions require the actual operations of the arithmetic and logic units.

When it is detected by the second decoder 1408 for the first instruction, the first arithmetic and logic unit 1410 is inactivated through the signal line 1435, and when it is detected by the second decoder 1409 for the second instruction, the second arithmetic and logic unit 1412 is inactivated through the signal line 1436. In this manner, the power consumption of the arithmetic and logic units is saved.

In the present embodiment, the two-instruction super scalar microprocessor has been discussed, although the present invention is also effective to other control system of the super scalar and a processor having a multi-instruction parallel processing function instead of the two-instruction processing. The present invention is applicable not only to the RISC processor but also to a CISC processor.

In the present embodiment, the single chip microprocessor has been discussed. In other semiconductor integrated circuit device such as a one-chip LSI, a similar effect may be attained by predicting the start of operation of a functional circuit block and controlling a circuit current of the functional circuit block. In this case, the method of predicting the start of operation and the timing to control the circuit current depend on the configuration and the application of the device. By predicting the start of operation prior to the start of operation and activating the functional circuit block prior to the start of operation to prevent malfunction due to the switching of the current, the power consumption saving and the normal operation are assured and the high speed operation of the device is attained, in accordance with the essence of the present embodiment.

The present embodiment is applicable not only to the semiconductor integrated circuit but also to a conventional electronic circuit.

In accordance with the present invention, the semiconductor integrated circuit device, particularly the microprocessor having a non-chip memory such as a cache memory, which attains the low power consumption of the functional circuit block and the high speed operation is provided.

What is claimed is:

1. A method for controlling power consumption in a semiconductor circuit device having at least one functional circuit block, wherein a subject instruction is executed by a selected functional circuit block of said at least one functional circuit block, said method comprising the steps of:

detecting whether said at least one functional circuit block is required for execution of said subject instruction by a result of decoding said subject instruction;

activating said at least one functional circuit block responsive to said subject instruction, from low power mode to normal operation mode when said at least one functional block is required for execution; and deactivating said at least one functional circuit block responsive to said subject instruction, from said normal operation mode to said low power mode after execution of said subject instruction.

2. A method as defined claim 1, wherein said activating step includes the step of supplying a clock to said at least one functional block, and said deactivating step includes the step of stopping supply of a clock to said at least one functional block.

3. A method as defined in claim 1, wherein said activating step includes the step of increasing a circuit current of said at least one functional circuit block to a predetermined level in a predetermined time and said deactivating step includes the step of reducing said circuit current to a low power mode current in a predetermined time.

4. A semiconductor integrated circuit device comprising:

a functional circuit block having a power supply line inductance L, an allowable power supply noise $V_n$ and a circuit current changing amplitude $\Delta I$; and means for generating an operation previous notice signal to activate said functional circuit block a time T prior to a start of operation, said T, L, $V_n$ and $\Delta I$ meeting a relation of $$T \geq L \frac{\Delta I}{V_n}.$$

5. A method for controlling power consumption of a functional circuit block comprising the steps of:

detecting whether said functional circuit block is required for execution of a subject instruction by a result of decoding said subject instruction, and if required, generating a previous notice signal responsive to said subject instruction, predicting a start of operation of said functional circuit block prior to the start of operation;

increasing a circuit current of said functional circuit block to a predetermined operation power level responsive to said subject instruction, in a predetermined time as measured starting from a time of reception of said previous notice signal to shift from a low power consumption mode to an operation mode;

executing an operation of said functional circuit block in said operation mode; and reducing the circuit current to a predetermined level responsive to said subject instruction, in a predetermined time as measured after termination of execution of the operation of said functional circuit block to shift to the low power consumption mode.

6. A memory comprising:

a memory array;

an address decoder for selecting the memory array in response to an address signal to select the memory array;

a sense amplifier for amplifying a signal read from said memory array to a predetermined signal level; and a current control signal generator for generating a current control signal to increase a circuit current of said memory array, an address decoder or said sense amplifier to a predetermined level in a predetermined time in response to an access previous notice signal for said memory array.

7. A memory according to claim 6 wherein said current control signal generator includes means for generating a control signal to reduce the circuit current of said memory array, said address decoder or said sense amplifier to a predetermined level in a predetermined time after the termination of the operation of said memory array, said address decoder or said sense amplifier.

8. A microprocessor for parallely fetching and decoding n (where n>2) instructions and for parallely executing said n instructions by n arithmetic and logic units, comprising:

clock drivers for respectively supplying clocks to said n arithmetic and logic units;

a detector for detecting whether said n arithmetic and logic units are required for execution of said n instructions by a result of decoding said n instructions of said n arithmetic and logic units;

wherein said clock drivers start supplying clocks to said n arithmetic and logic units when said n arithmetic and logic units are required for use.

9. A microprocessor as defined in claim 8, wherein said clock drivers stop supplying clocks to said n arithmetic and logic units when said n arithmetic and logic units are not required for use.

10. A microprocessor comprising:

a program counter for indicating instructions to be read out from a memory;

a plurality of instruction registers for respectively storing instructions therein as indicated by said program counter;

a plurality of arithmetic and logic units for carrying out a parallel processing in accordance with instructions read from said instruction registers;

a detector for detecting a conflict between instructions in the parallel processing of instructions, a clock driver circuit for respectively supplying clocks to said plurality of arithmetic and logic units, wherein, when a conflict is detected by said detector, said clock driver circuit starts supplying said clock to at least one arithmetic and logic unit corresponding to at least one instruction to be executed prior to execution of said conflicted instructions.

11. A microprocessor comprising:

at least one functional circuit block, wherein an instruction is executed by a selected functional circuit block of said at least one functional circuit block;

a decoder for decoding a subject instruction and for detecting whether said at least one functional circuit block is required for execution of said subject instruction by a result of decoding said subject instruction;

an activating circuit for activating said at least one functional circuit block responsive to said subject instruction, from a low power mode to a normal operation mode when said at least one functional circuit block is required for execution, and deactivating said at least one functional circuit block responsive to said subject instruction, from said normal operation mode to said low power mode after execution of said subject instruction.

12. A microprocessor as defined in claim 11, wherein said activating circuit includes a clock driver circuit for supplying a clock to said at least one functional circuit block, wherein said clock driver circuit starts supplying said clock to said at least one functional circuit block when said at least one functional circuit block is required for execution.

13. A microprocessor as defined in claim 11, wherein said activating circuit includes a clock driver circuit for supplying a clock to said at least one function circuit block, wherein said clock driver circuit starts supplying said clock to said at least one functional circuit block when said at least one functional circuit block is required for execution, and wherein said clock driver circuit stops supplying said clock to said at least one functional circuit block when said at least one functional circuit block has carried out execution of said subject instruction.

14. A system having a microprocessor and a memory coupled to said microprocessor through a memory interface of said microprocessor, wherein said microprocessor comprises;

at least one functional circuit block, wherein an instruction is executed by a selected functional circuit block of said at least one functional circuit block;

a decoder for decoding a subject instruction and for detecting whether said at least one functional circuit block is required for execution of said subject instruction by a result of decoding said subject instruction;

an activating circuit for activating said at least one functional circuit block responsive to said subject instruction, from a low power mode to a normal operation mode when said at least one functional circuit block is required for execution, and deactivating said at least one functional circuit block responsive to said subject instruction, from said normal operation mode to said low power mode after execution of said subject instruction.

15. A system as defined in claim 14, wherein said activating circuit includes a clock driver circuit for supplying a clock to said at least one functional circuit block, wherein said clock driver circuit starts supplying said clock to said at least one functional circuit block when said at least one functional circuit block is required for execution.

16. A microprocessor as defined in claim 14, wherein said activating circuit includes a clock driver circuit for supplying a clock to said at least one functional circuit block, wherein said clock driver circuit starts supplying said clock to said at least one functional circuit block when said at least one functional circuit block is required for execution, and wherein said clock driver circuit stops supplying said clock to said at least one functional circuit block when said at least one functional circuit block has carried out execution of said subject instruction.

17. A method for controlling power consumption in a semiconductor circuit device having at least one functional circuit block, wherein an instruction is executed by a selected functional circuit block of said at least one functional circuit block, said method comprising the steps of:

detecting whether said at least one functional circuit block is required for execution of an instruction by a result of decoding said instruction;

activating said at least one functional circuit block before execution of said instruction, from low power mode to normal operation mode when said at least one functional block is required for execution; and deactivating said at least one functional circuit block responsive to completion of execution of said instruction, from said normal operation mode to said low power mode after execution of said instruction.

18. A method for controlling power consumption of a functional circuit block comprising the steps of:

detecting whether said functional circuit block is required for execution of an instruction by a result of decoding said instruction, and if required, generating a previous notice signal responsive to said instruction, predicting a start of operation of said functional circuit block prior to the start of operation;

increasing a circuit current of said functional circuit block to a predetermined operation power level before execution of said instruction, in a predetermined time as measured starting from a time of reception of said previous notice signal to shift from a low power consumption mode to an operation mode;

executing an operation of said functional circuit block in said operation mode; and reducing the circuit current to a predetermined level responsive to completion of execution of said instruction, in a predetermined time as measured after termination of execution of the operation of said functional circuit block to shift to the low power consumption mode.

19. A microprocessor comprising:

at least one functional circuit block, wherein instructions are executed by a selected functional circuit block of said at least one functional circuit block;

a decoder for decoding an instruction and for detecting whether said at least one functional circuit block is decoding said execution of said instruction by a result of decoding said instruction;

an activating circuit for activating said at least one functional circuit block from a low power mode to a normal operation mode when said at least one functional circuit block is required for execution, and deactivating said at least one functional circuit block responsive to completion of execution of said instruction, from said normal operation mode to said low power mode after execution of said instruction.

20. A system having a microprocessor and a memory coupled to said microprocessor through a memory interface of said microprocessor, wherein said microprocessor comprises;

at least one functional circuit block, wherein an instructions are executed by a selected functional circuit block of said at least one functional circuit block;

a decoder for decoding an instruction and for detecting whether said at least one functional circuit block is required for execution of said instruction by a result of decoding said instruction;

an activating circuit for activating said at least one functional circuit block responsive to said instruction, from a low power mode to a normal operation mode when said at least one functional circuit block is required for execution, and deactivating said at least one functional circuit block responsive to completion of execution of said instruction, from said normal operation mode to said low power mode after execution of said instruction.

* * * * *